US012813161B2

(12) United States Patent
Lin et al.

(10) Patent No.: US 12,813,161 B2
(45) Date of Patent: Nov. 24, 2026

(54) METHOD FOR MANUFACTURING SEMICONDUCTOR STRUCTURE AND SEMICONDUCTOR STRUCTURE THEREOF

(71) Applicant: TAIWAN SEMICONDUCTOR MANUFACTURING COMPANY LTD., Hsinchu (TW)

(72) Inventors: Ching-Hui Lin, Taichung City (TW); Fu-Chun Huang, Hsinchu County (TW); Chun-Ren Cheng, Hsinchu City (TW); Wei Chun Wang, Taipei City (TW); Chao-Hung Chu, Keelung City (TW); Yi-Hsien Chang, Changhua County (TW); Po-Chen Yeh, New Taipei City (TW); Chi-Yuan Shih, Hsinchu (TW); Shih-Fen Huang, Hsinchu County (TW); Yan-Jie Liao, Hsinchu City (TW); Sheng Kai Yeh, Taichung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1224 days.

(21) Appl. No.: 17/707,078

(22) Filed: Mar. 29, 2022

(65) Prior Publication Data

US 2023/0320227 A1 Oct. 5, 2023

(51) Int. Cl.

*H10N 30/50* (2023.01)
*H10N 30/03* (2023.01)

(Continued)

(52) U.S. Cl.

CPC ............. *H10N 30/50* (2023.02); *H10N 30/03* (2023.02); *H10N 30/05* (2023.02); *H10N 30/063* (2023.02)

(58) Field of Classification Search

CPC ........ H10N 30/50; H10N 30/03; H10N 30/05; H10N 30/063; H10N 30/875; H10N 30/883; H10N 30/06

See application file for complete search history.

(56) References Cited

U.S. PATENT DOCUMENTS 6,013,926 A * 1/2000 Oku ........................ H10D 30/01 257/283
7,723,822 B2 * 5/2010 Inaba .................... B81B 3/0005 257/532

(Continued)

FOREIGN PATENT DOCUMENTS

TW 202012923 A * 4/2020 ........... H10N 30/878

OTHER PUBLICATIONS

Translation of TW-202012923-A (Year: 2020).*

*Primary Examiner* — Jeffrey T Carley
(74) *Attorney, Agent, or Firm* — WPAT LAW; Anthony King

(57) ABSTRACT

A method for manufacturing a semiconductor structure is provided. The method may include several operations. A piezoelectric capacitor is formed over a substrate, wherein the piezoelectric capacitor includes a metal electrode. An intermediate layer is formed on the metal electrode, and is patterned using a first mask layer as a mask. A metal layer is formed on the intermediate layer, wherein the metal layer electrically connects to the metal electrode. The metal layer is patterned using a second mask layer, wherein the intermediate layer is within a coverage area of the metal layer from a top-view perspective after the patterning of the metal layer. A semiconductor structure thereof is also provided.

20 Claims, 35 Drawing Sheets

(51) Int. Cl.
*H10N 30/05* (2023.01)
*H10N 30/063* (2023.01)

(56) References Cited

U.S. PATENT DOCUMENTS

| | | | | |
|---|---|---|---|---|
| 9,270,254 | B2 * | 2/2016 | Zuo | H03H 9/2405 |
| 10,389,331 | B2 * | 8/2019 | Hurwitz | H03H 9/0523 |
| 10,797,681 | B1 * | 10/2020 | Hurwitz | H01L 21/76871 |
| 11,179,748 | B2 * | 11/2021 | Ohashi | A61B 8/14 |
| 11,245,383 | B2 * | 2/2022 | Hurwitz | H03H 9/1014 |
| 11,411,168 | B2 * | 8/2022 | Moe | C23C 14/025 |
| 11,856,858 | B2 * | 12/2023 | Moe | C23C 16/45523 |
| 12,603,634 | B2 * | 4/2026 | Caron | H03H 9/02102 |
| 2007/0025050 | A1 * | 2/2007 | Shimanouchi | H01G 5/015 361/277 |
| 2009/0302363 | A1 * | 12/2009 | Nagai | H10B 53/00 257/295 |
| 2013/0062996 | A1 * | 3/2013 | Udayakumar | H10N 39/00 310/321 |
| 2018/0048290 | A1 * | 2/2018 | Sekine | H03H 9/542 |
| 2020/0098517 | A1 * | 3/2020 | Lin | H01G 4/12 |
| 2020/0136010 | A1 * | 4/2020 | Chen | H04R 17/02 |
| 2021/0082715 | A1 * | 3/2021 | Rubloff | H10N 30/503 |

* cited by examiner

METHOD FOR MANUFACTURING SEMICONDUCTOR STRUCTURE AND SEMICONDUCTOR STRUCTURE THEREOF

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of patterns of each elements and components as designed have arisen.

BRIEF DESCRIPTION OF THE. DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion, FIG. 1 is a flow diagram of a method for manufacturing a semiconductor structure in accordance with some embodiments of the disclosure.

DETAILED DESCRIPTION

Figure 1:
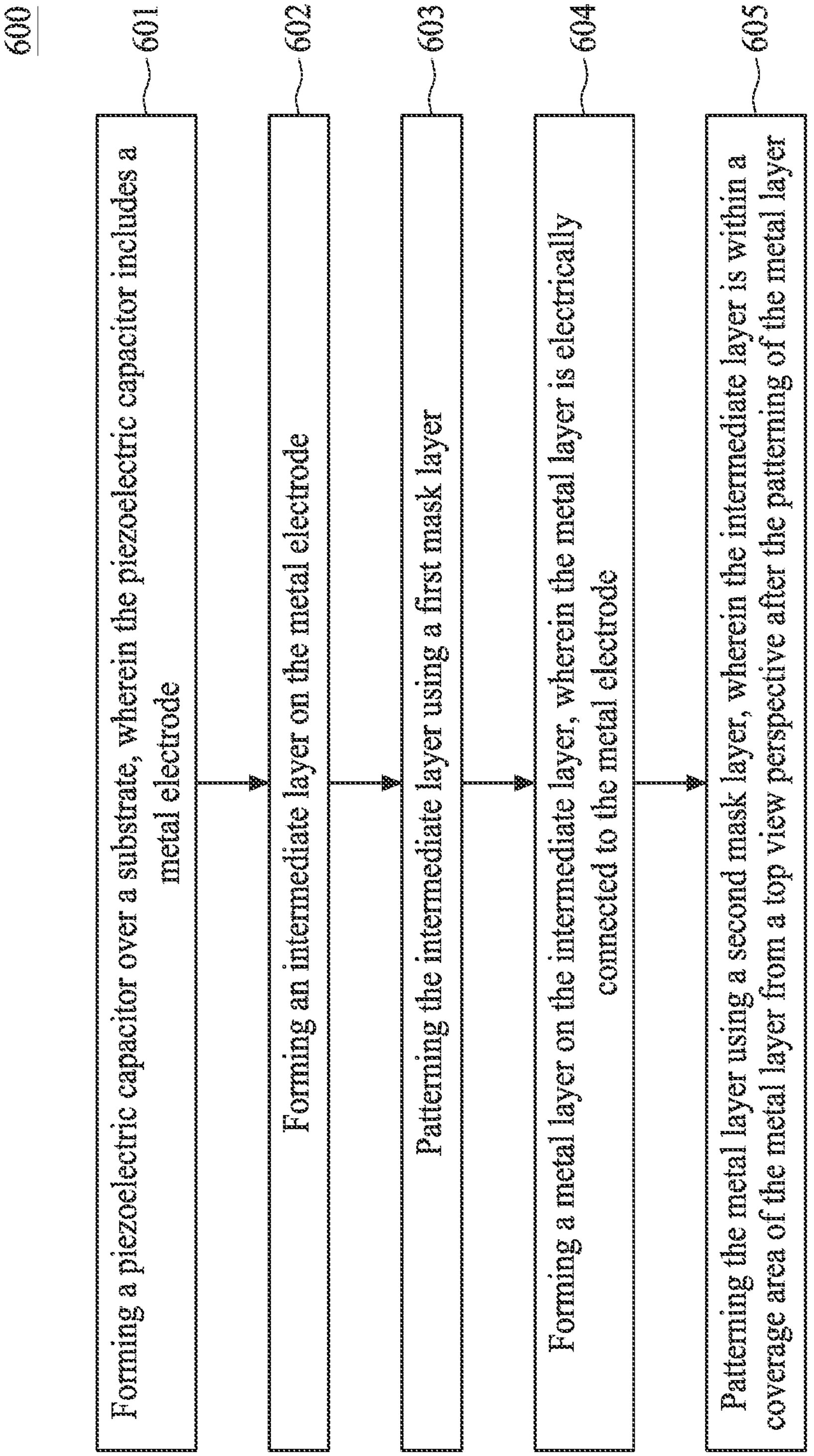

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another elements) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With continuing size reductions in each new generation of semiconductor devices, formation of the devices with precise configuration and layout becomes an increasingly significant issue. Formation of elements or layers can include one or multiple patterning operations. However, examination after each patterning operation cannot prevent misalignment of a configuration or damage to material that is only observed on a final structure after manufacturing processing. For instance, a metal component may be observed to have uniformity of material after formation, but impurities later appear in the same metal component in the final structure. For another instance, a redistribution layer may be observed to have a smooth boundary after a patterning operation, but the smooth boundary then becomes uneven in the final structure (such uneven boundary is referred to as a mouse bite defect, which has a resembling mouse bite). Functions of a semiconductor device may be altered or fail due to the defects described above, and a product's service life becomes unpredictable.

Through research, it has been discovered that the above issues commonly occur in certain metals with certain properties. In order to solve the issues, the present disclosure provides a manufacturing method of a semiconductor structure including formation of an intermediate layer having certain selections of one or more metals, and a semiconductor structure thereof is also provided.

FIG. 1 is a flow diagram of a method 600 for manufacturing a semiconductor structure in accordance with some embodiments of the present disclosure. The method 600 includes a number of operations (601, 602, 603, 604 and 605) and the description and illustration are not deemed as a limitation to the sequence of the operations. A piezoelectric capacitor is formed over a substrate in the operation 601, wherein the piezoelectric capacitor includes a metal electrode. An intermediate layer is formed on the metal electrode in the operation 602, and then is patterned in the operation 603 using a first mask layer as a mask. A metal layer is formed on the intermediate layer in the operation 604, wherein the metal layer is electrically connected to the metal electrode. The metal layer is patterned in the operation 605 using a second mask layer, wherein the intermediate layer is within a coverage area of the metal layer from a top-view perspective after the patterning of the metal layer. It should be noted that the operations of the method 600 may be rearranged or otherwise modified within the scope of the various aspects. Additional processes may be provided before, during, and after the method 600, and some other processes may be only briefly described herein. Thus, other implementations are possible within the scope of the various aspects described herein.

Figure 2:
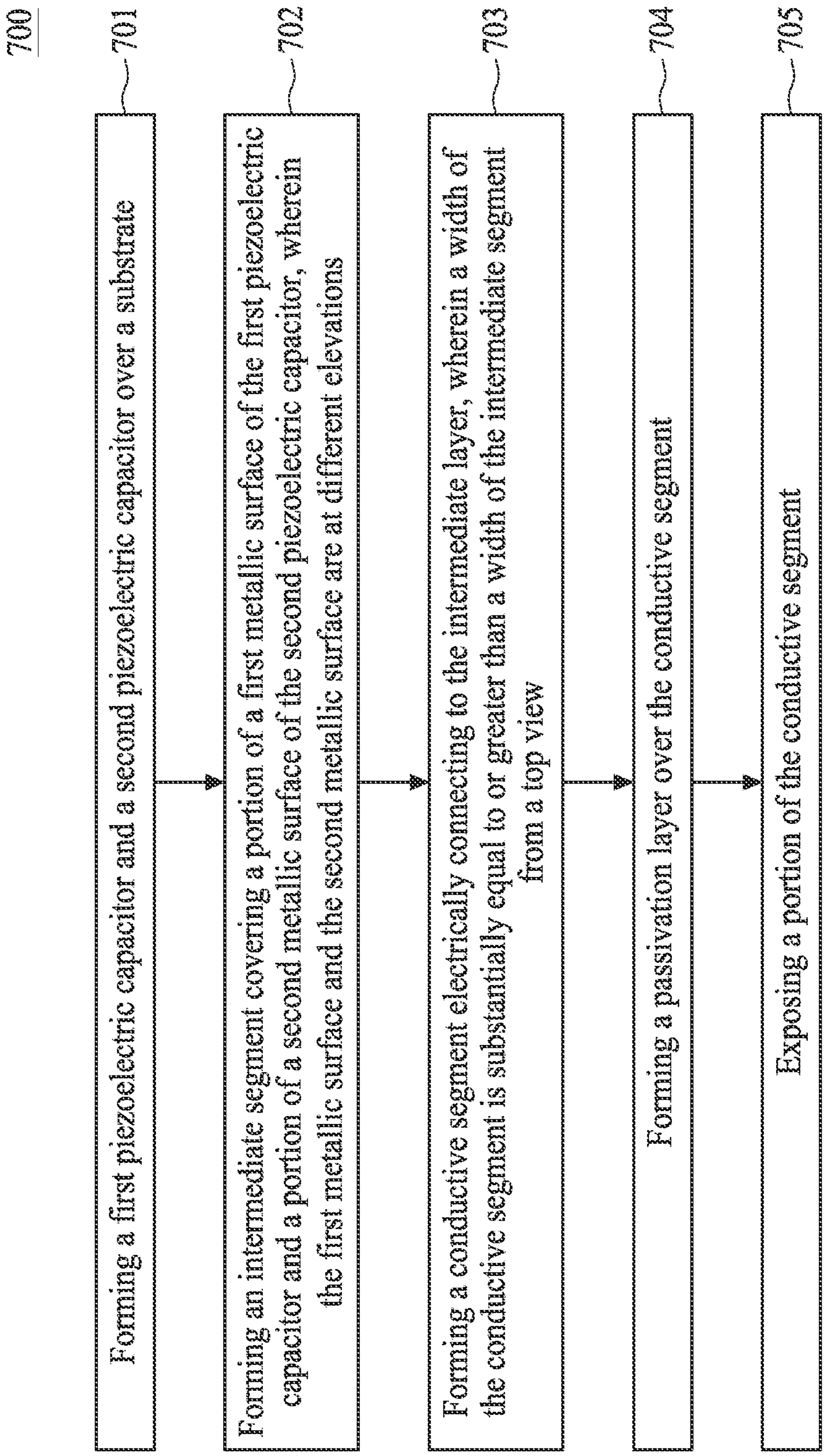
FIG. 2 is a flow diagram of a method for manufacturing a semiconductor structure in accordance with some embodiments of the disclosure.

FIG. 2 is a flow diagram of a method 700 for manufacturing a semiconductor structure in accordance with some embodiments of the present disclosure. The method 700 includes a number of operations (701, 702, 703, 704 and 705) and the description and illustration are not deemed as a limitation to the sequence of the operations. A first piezoelectric capacitor and a second piezoelectric capacitor are formed over a substrate in the operation 701. An intermediate segment is formed in the operation 702. The intermediate segment covers a portion of a first metallic surface of the first piezoelectric capacitor and a portion of a second metallic surface of the second piezoelectric capacitor, and the first metallic surface and the second metallic surface are at different elevations. A conductive segment is formed in the operation 703. The conductive segment electrically connects to the intermediate segment, wherein a width of the conductive segment is substantially equal to or greater than a width of the intermediate segment from a top view. A passivation layer is formed over the conductive segment in the operation 704, and a portion of the conductive segment is exposed in the operation 705. It should be noted that the operations of the method 700 may be rearranged or otherwise modified within the scope of the various aspects. Additional processes may be provided before, during, and after the method 700, and some other processes may be only briefly described herein. Thus, other implementations are possible within the scope of the various aspects described herein.

The method 600 and the method 700 are within a same concept of the present disclosure, and in order to further illustrate details of the method 600, the method 700, and the concept of the present disclosure, the method 600 and the method 700 are comprehensively illustrated with embodiments of the present disclosure.

Figure 3:
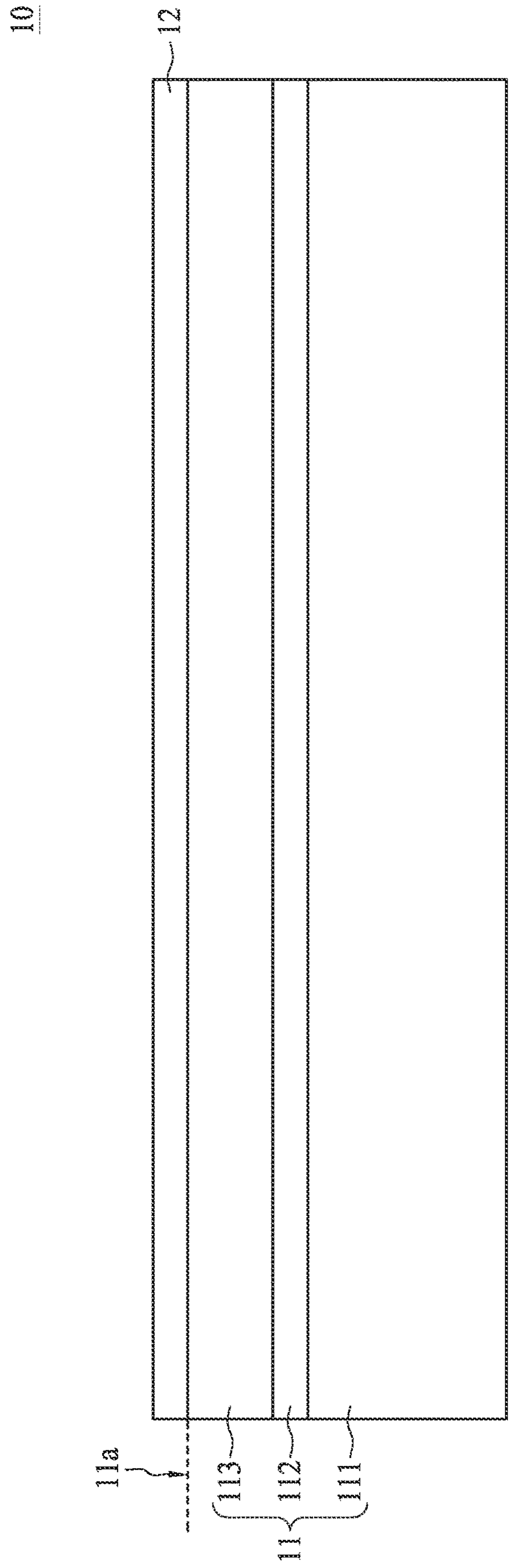
FIGS. 3 to 12 are schematic diagrams at different stages of a method for manufacturing a semiconductor structure in accordance with different embodiments of the disclosure.

Please refer to FIG. 3, which is a schematic cross-sectional diagram of a semiconductor structure 10 at a stage of the method 600 and/or a stage of the method 700 in accordance with some embodiments of the present disclosure. Prior to the operation 601 and/or the operation 701, a substrate 11 is provided, received, or formed. In some embodiments, the substrate 11 is a silicon-on-insulator (SOI) In some embodiments, the substrate 11 includes a bulk substrate 111, an insulator 112 and a silicon layer 113. The bulk substrate 111 can be a silicon wafer. In some embodiments, the method 600 and/or the method 700 further include formation of a dielectric layer 12 over a first surface 11*a* of the substrate 11 prior to the operation 601 and/or the operation 701. In some embodiments, the dielectric layer 12 includes oxide, nitride, oxinitride, or a combination thereof.

Figure 4:
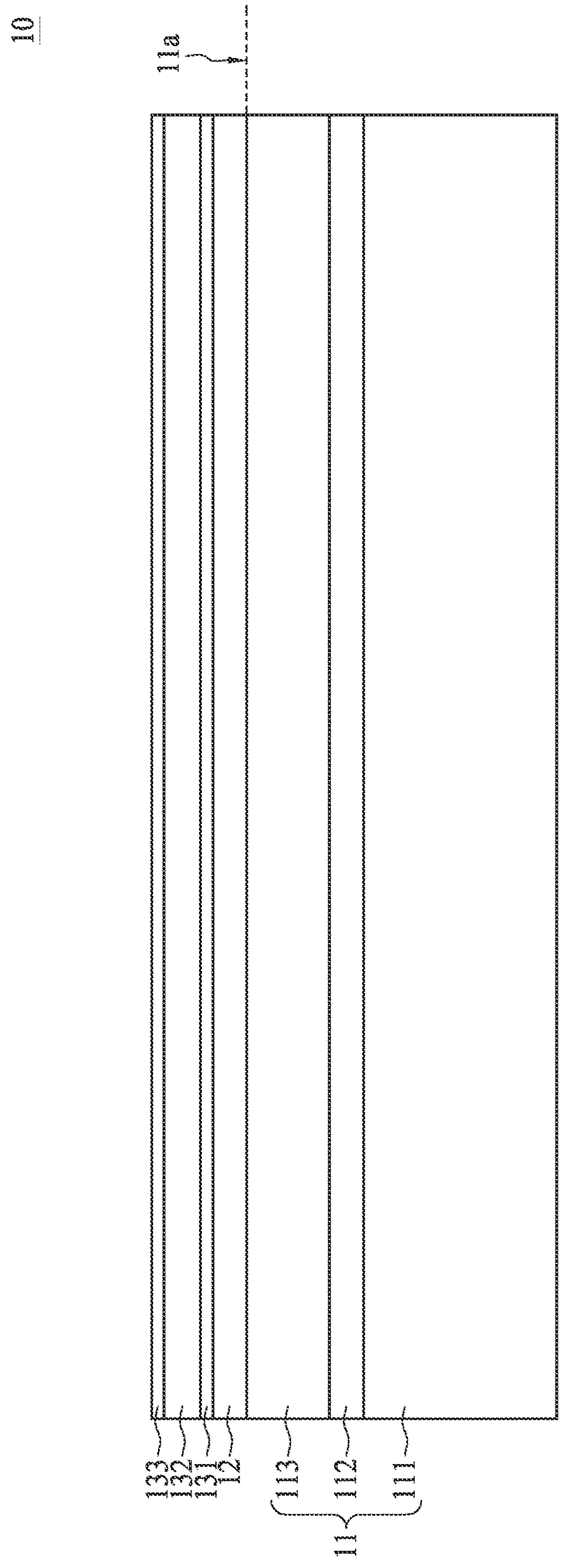
Figure 5:
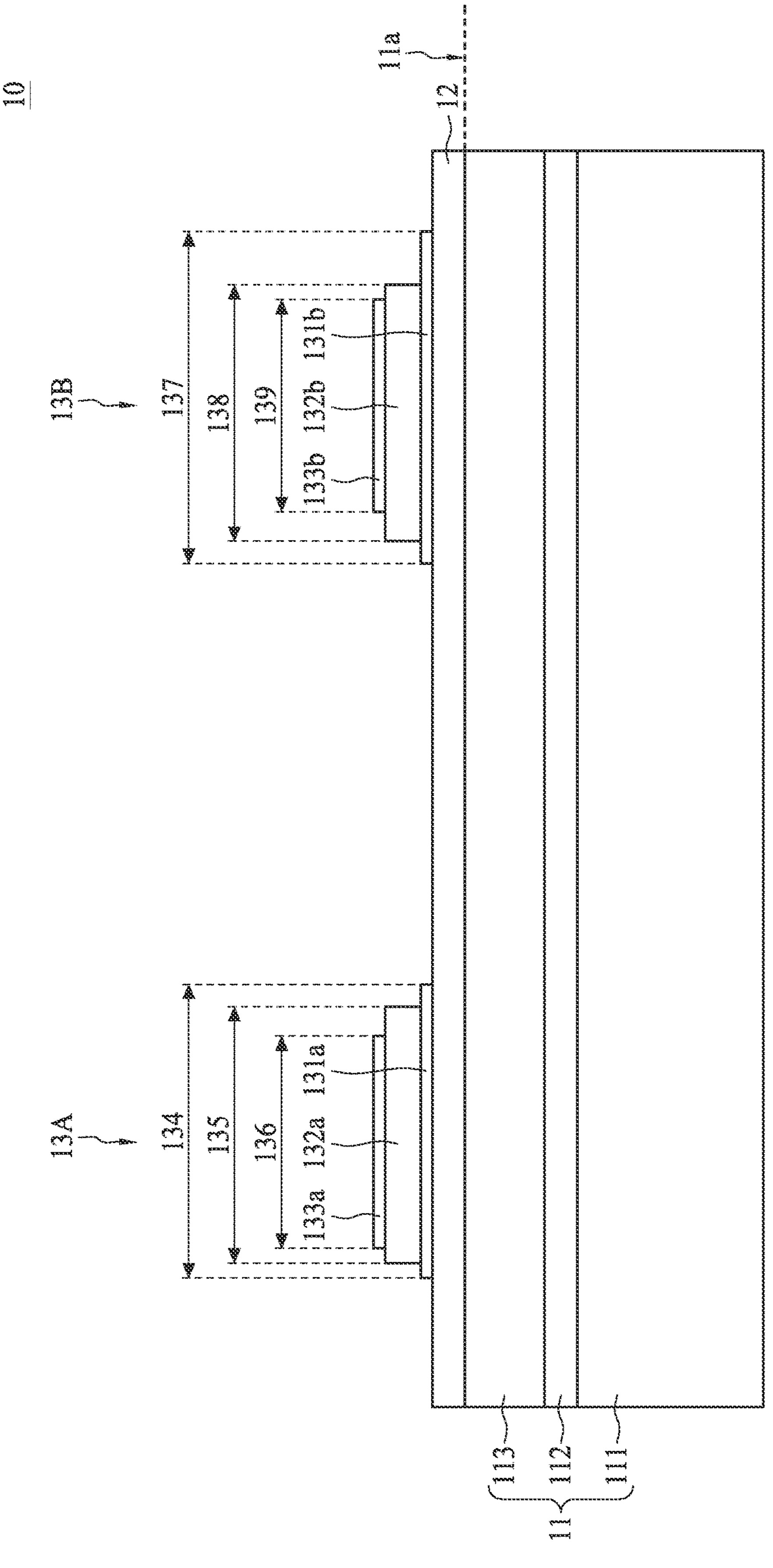

Please refer to FIGS. 4 to 5, which are schematic cross-sectional diagrams of the semiconductor structure 10 at different stages of the method 600 and/or the method 700 according to some embodiments of the present disclosure. In the operation 601 and/or the operation 701, a piezoelectric capacitor 13A and/or a piezoelectric capacitor 13B are formed over the substrate 11, as shown in FIG. 4. The operation 601 and/or the operation 701 each may include several steps. A first metal layer 131, a piezoelectric material layer 132 and a second metal layer 133 are formed in sequence over the first surface 11*a* of the substrate 11 and the dielectric layer 12. In some embodiments, each of the first metal layer 131, the piezoelectric material layer 132 and the second metal layer 133 is formed by a blanket deposition. In some embodiments, the first metal layer 131 and the second metal layer 133 include the same or different metallic materials. In some embodiments, the metallic material includes platinum (Pt), gold (Au), zinc (Zn), copper (Cu), ruthenium (Ru), or a combination thereof. In some embodiments, the piezoelectric material layer 132 includes quartz. It should be noted that the piezoelectric capacitor 13A and/or the piezoelectric capacitor 13B are exemplary embodiments for a purpose of illustrate. In other embodiments, the capacitor 13A and/or the capacitor 13B can be other types of capacitors.

The first metal layer 131, the piezoelectric material layer 132 and the second metal layer 133 are then patterned to form the piezoelectric capacitor 13A and the piezoelectric capacitor 13B as shown in FIG. 5. Different portions of the first metal layer 131 become bottom electrodes (or lower electrodes) of different piezoelectric capacitors after the patterning of the first metal layer 131. In some embodiments, a portion of the first metal layer 131 becomes a bottom electrode 131*a* of the piezoelectric capacitor 13A and another portion of the first metal layer 131 becomes a bottom electrode 131*b* of the piezoelectric capacitor 13B. Different portions of the piezoelectric material layer 132 become separators of different piezoelectric capacitors between the electrodes after patterning of the piezoelectric material layer 132. In some embodiments, a portion of the piezoelectric material layer 132 becomes a piezoelectric layer 132*a* of the piezoelectric capacitor 13A and another portion of the piezoelectric material layer 132 becomes a piezoelectric layer 132*b* of the piezoelectric capacitor 13B. Different portions of the second metal layer 133 become top electrodes (or upper electrodes) of different piezoelectric capacitors after the patterning of the second metal layer 133. In some embodiments, a portion of the second metal layer 133 becomes a top electrode 133*a* of the piezoelectric capacitor 13A and another portion of the second metal layer 133 becomes a top electrode 133*b* of the piezoelectric capacitor 13B. It should be noted that in alternative embodiments the capacitors HA and/or 13B being another type of capacitors, the piezoelectric material layer 132 includes a dielectric material, such as oxide, nitride, oxynitride, or a combination thereof.

In some embodiments, the piezoelectric capacitor 13A and/or the piezoelectric capacitor 13B is tapered from the substrate 11. In some embodiments, the bottom electrode 131*a* extends beyond the piezoelectric layer 132*a* of the piezoelectric capacitor 13A. In some embodiments, the bottom electrode 131*a* protrudes farther than the piezoelectric layer 132*a* of the piezoelectric capacitor 13A. 1*n* some embodiments, the bottom electrode 131*a* protrudes from the piezoelectric layer 132*a* of the piezoelectric capacitor 13A from a top-view perspective. In some embodiments, the piezoelectric layer 132*a* extends beyond the top electrode 133*a* of the piezoelectric capacitor 13A. In some embodiments, the piezoelectric layer 132*a* protrudes farther than the top electrode 133*a* of the piezoelectric capacitor 13A. In some embodiments, the piezoelectric layer 132*a* protrudes from the top electrode 133*a* of the piezoelectric capacitor 13A from a top-view perspective. Similarly, the bottom electrode 131*b* can be extends beyond or protrudes farther than the piezoelectric layer 132*b* of the piezoelectric capacitor 13B. In some embodiments, the bottom electrode 131*b* protrudes from the piezoelectric layer 132*b* of the piezoelectric capacitor 13B from a top-view perspective. The piezoelectric layer 132*b* can extend beyond or protrude farther than the top electrode 133*b* of the piezoelectric capacitor 13B. In some embodiments, the piezoelectric layer 132*b* protrudes from the top electrode 133*b* of the piezoelectric capacitor 13B from a top-view perspective. In some embodiments, a width 134 of the bottom electrode 131*a* is greater than a width 135 of the piezoelectric layer 132*a* of the piezoelectric capacitor 13A. In some embodiments, the width 135 of the piezoelectric layer 132*a* is greater than a width 136 of the top electrode 133*a* of the piezoelectric capacitor 13A. In some embodiments, a width 137 of the bottom electrode 131*b* is greater than a width 138 of the piezoelectric layer 132*b* of the piezoelectric capacitor 13B. In some embodiments, the width 138 of the piezoelectric layer 132*b* is greater than a width 139 of the top electrode 133*b* of the piezoelectric capacitor 13B.

In some embodiments, the first metal layer 131, the piezoelectric material layer 132 and the second metal layer 133 are patterned in sequence. In some embodiments, the patterning operations of the first metal layer 131, the piezoelectric material layer 132 and the second metal layer 133 can be performed after formation of the three layers 131, 132 and 133 as shown in FIGS. 4 to 5. In some embodiments, the formation and patterning operations of the first metal layer 131 are performed consecutively, the formation and patterning operations of the piezoelectric material layer 132 are next performed consecutively, and the formation and patterning operations of the second metal layer 133 are next performed consecutively. Details of the formation of the piezoelectric capacitors 13A and 13B are not limited herein, and conventional methods can be applied. Moreover, the piezoelectric capacitors 13A and 13B shown in the cross-sectional view of FIG. 5 can be arranged as two adjacent capacitors. In other words, the piezoelectric capacitors 13A and 13B are physically separated from a top-view perspective. However, in other embodiments, the cross-sectional view of FIG. 5 illustrates one piezoelectric capacitor. That is, the elements 13A and 13B shown in FIG. 5 can be different portions of one piezoelectric capacitor, and the elements 13A and 13B are connected from a top-view perspective. A configuration of the piezoelectric capacitors 13A and 13B from a top-view perspective is not limited herein. The configuration can be adjusted according to different applications.

Figure 6:
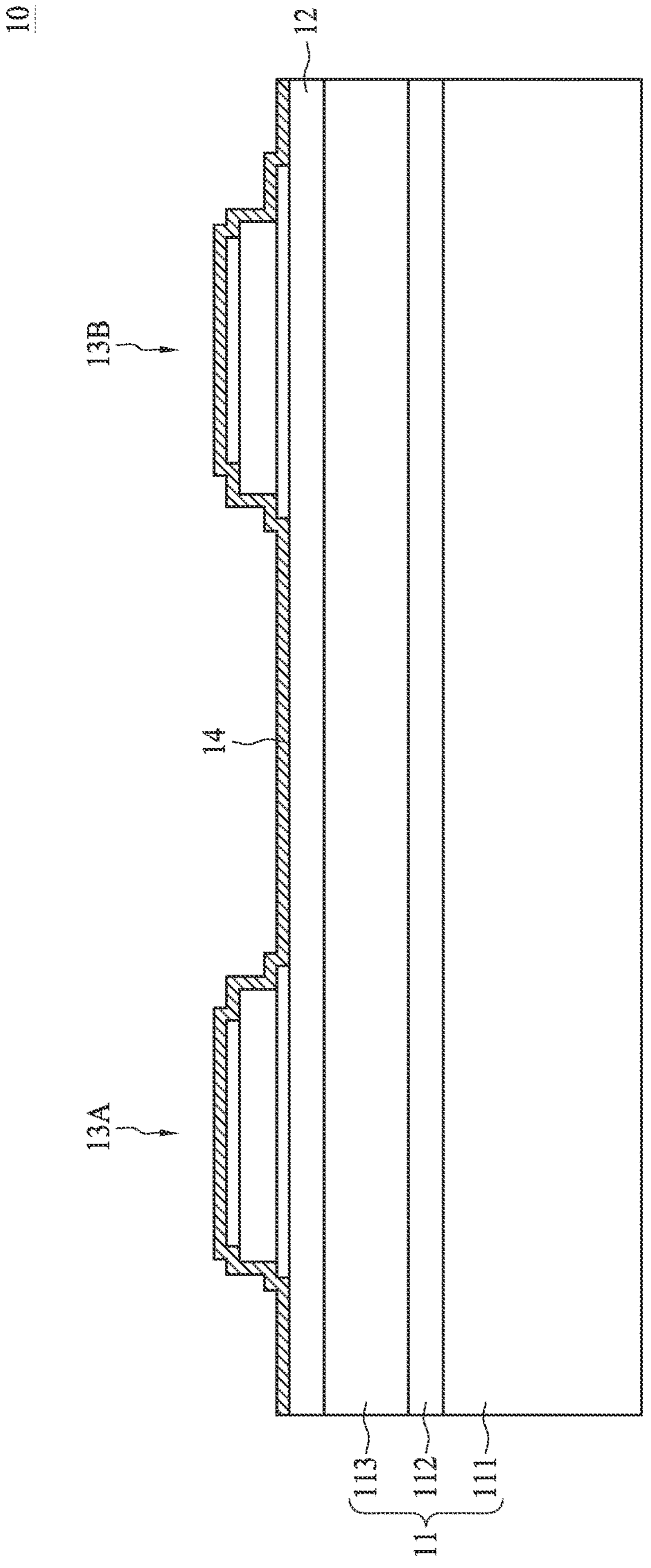

Please refer to FIG. 6, which is a schematic cross-sectional diagram of the semiconductor structure 10 at a stage of the method 600 and/or a stage of the method 700 in accordance with some embodiments of the present disclosure. After the operation 601 and/or the operation 701, a high-k material layer 14 is formed conformally over the piezoelectric capacitors 13A and 13B. In some embodiments, the high-k material layer 14 is formed by a conformal deposition. In some embodiments, the high-k material layer 14 includes a material having a dielectric constant k greater than 3.9. In some embodiments, the high-k material layer 14 includes hafnium oxide ($HfO_2$), hafnium silicate ($HfSiO_4$), hafnium silicon oxynitride (HfSiON), hafnium tantalum oxide (HfTAO), hafnium titanium oxide (HMO), hafnium zirconium oxide (HfZrO), zirconium oxide, aluminum oxide, titanium oxide, hafnium dioxide-alumina ($HfO_2$—$Al_2O_3$) alloy, other suitable high-k dielectric materials, and/or combinations thereof.

Figure 7:
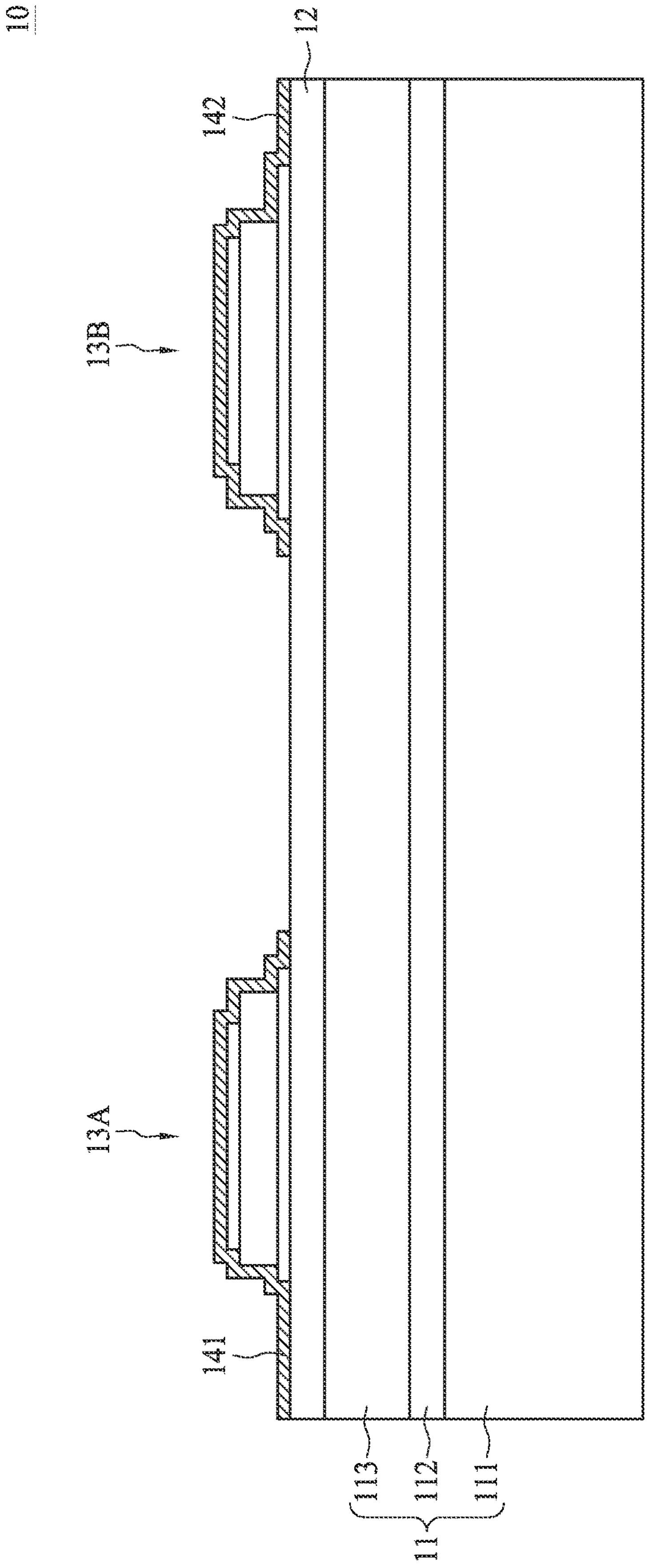

Please refer to FIG. 7, which is a schematic cross-sectional diagram of the semiconductor structure 10 at a stage of the method 600 and/or a stage of the method 700 in accordance with some embodiments of the present disclosure. After the formation of the high-k material layer 14, a patterning operation is performed to remove a portion of the high-k material layer 14. The portion of the high-k material layer 14 disposed vertically over a portion of the substrate 11, where a diaphragm is to be formed later, is removed for a purpose of simplifying subsequent processing. The high-k material layer 14 after the patterning operation includes a high-k layer 141 covering the piezoelectric capacitor 13A and a high-k layer 142 covering the piezoelectric capacitor 13B.

Figure 8:
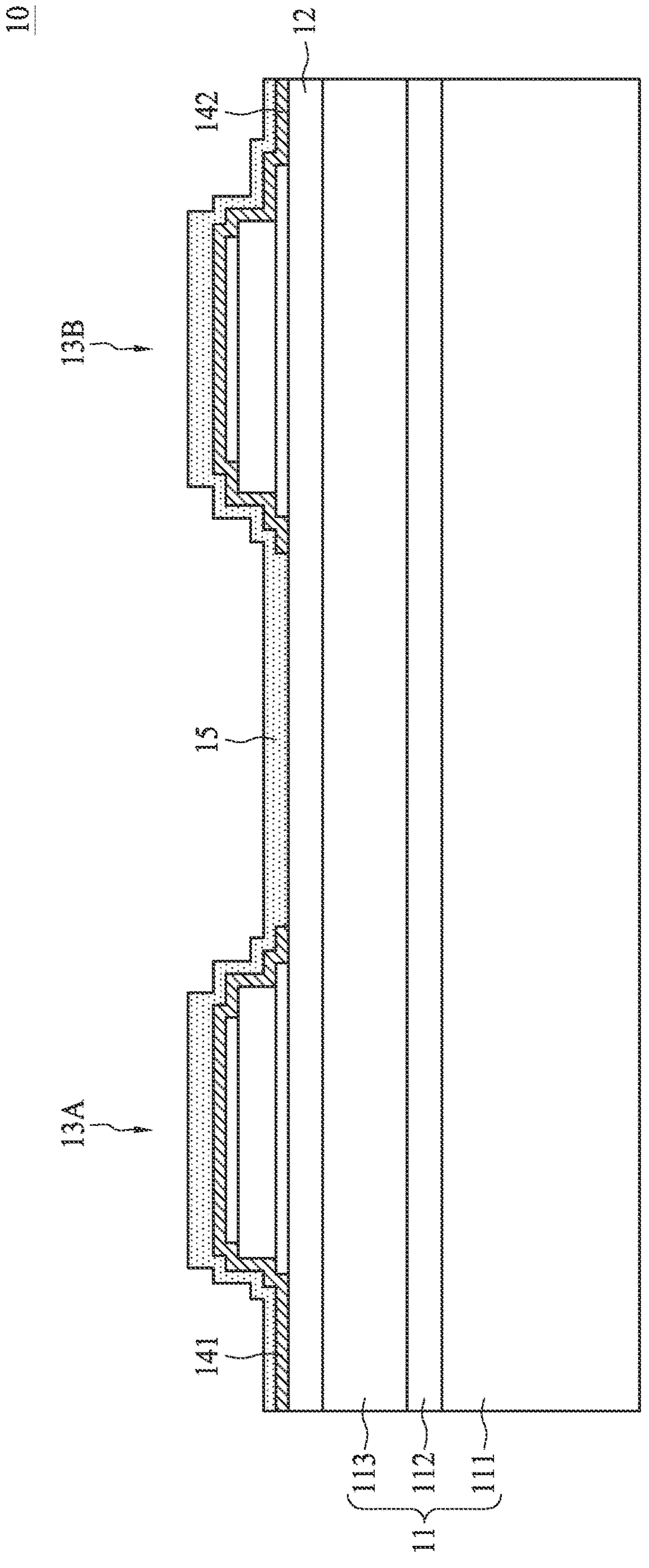

Please refer to FIG. 8, which is a schematic cross-sectional diagram of the semiconductor structure 10 at a stage of the method 600 and/or a stage of the method 700 in accordance with some embodiments of the present disclosure. After the patterning of the high-k material layer 14, a dielectric layer 15 is formed over the substrate 11 in a manner conformal to the piezoelectric capacitors 13A and 13B. In some embodiments, the dielectric layer 15 is formed by a conformal deposition, and a profile of the dielectric layer 15 is conformal to a profile of the high-k layers 141 and 142. The conformal deposition may include a chemical vapor deposition (CVD), a physical vapor deposition (PVD), an atomic layer deposition (ALD) or a combination thereof. 1*n* some embodiments, a thickness of the dielectric layer 15 is in a range of 1 kilo-angstrom (kA) to 10 kA. In some embodiments, a profile of the dielectric layer 15 is conformal to a profile of the piezoelectric capacitors 13A and 13B. In some embodiments, the dielectric layer 15 includes a material same as a material of the dielectric layer 12. In some embodiments, the dielectric layer 15 is an inter-metal dielectric layer.

Figure 9:
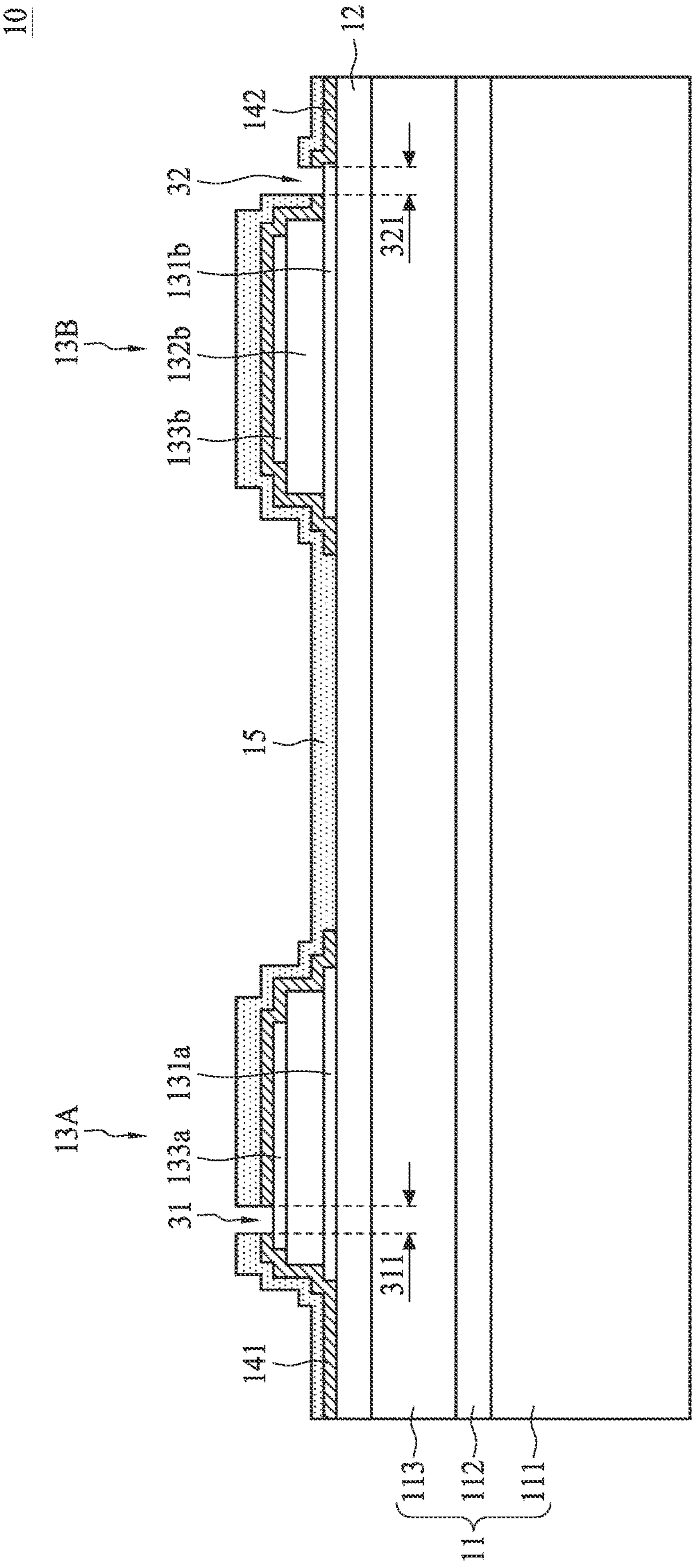

Please refer to FIG. 9, which is a schematic cross-sectional diagram of the semiconductor structure 10 at a stage of the method 600 and/or the method 700 in accordance with some embodiments of the present disclosure. After the formation of the dielectric layer 15, a metallic surface of the piezoelectric capacitor 13A and a metallic surface of the piezoelectric capacitor 13B are exposed. The metallic surface of the piezoelectric capacitor 13A can be a surface of the top electrode 133*a* and/or a surface of the bottom electrode 131*a*. Similarly, the metallic surface of the piezoelectric capacitor 13B can be a surface of the top electrode 133*b* and/or a surface of the bottom electrode 131*b*. In some embodiments, the metallic surfaces of the piezoelectric capacitors 13A and 13B are exposed by a lift-off operation. In some embodiments, the metallic surfaces of the piezoelectric capacitors 13A and 13B are exposed by an ion beam etching, a reactive ion etching or a wet etching. In some embodiments, the exposure of the metallic surfaces of the piezoelectric capacitors 13A and 13B is performed at a temperature in a range from room temperature to 100 degrees Celsius (° C.) In some embodiments, the room temperature is in a range of 15 to 30° C. In some embodiments, a width 311 of the opening 31 or a width 321 of the opening 32 is in a range of 10 microns (μm) to 200 μm. Configurations of the openings 31 and 32 from a top view are not limited herein. A configuration of the opening 31 or the opening 32 can be circular, rectangular, triangular, oval, or other types of polygons. The configuration of the opening 31 and the opening 32 can be similar or different, and can be adjusted according to different applications.

In some embodiments, an etching operation is performed to remove a portion of the dielectric layer 15 and a portion of the high-k layer 141 covering the top electrode 133*a* of the piezoelectric capacitor 13A, and an opening 31 is thereby formed exposing the metallic surface of the top electrode 133*a*. The same or a different etching operation is performed to remove a portion of the dielectric layer 15 and a portion of the high-k layer 142 covering the bottom electrode 131*b* of the piezoelectric capacitor 13B, and an opening 32 is thereby formed exposing the metallic surface of the bottom electrode 131*b*. More specifically, the removed portions of the dielectric layer 15 and the high-k layer 142 previously covered a protruding portion of the bottom electrode 131*b* extending beyond the piezoelectric layer 132*b* of the piezoelectric capacitor 13B from a top-view perspective before the removal of the portions. It should be noted that more than one opening 31 can be formed to expose the metallic surface of the piezoelectric capacitor 13A, and/or more than one opening 32 can be formed to expose the metallic surface of the piezoelectric capacitor 13B. However, only one opening 31 and one opening 32 are shown in the figures and description for a purpose of illustration only, and it is not intended to limit the present disclosure.

Figure 10:
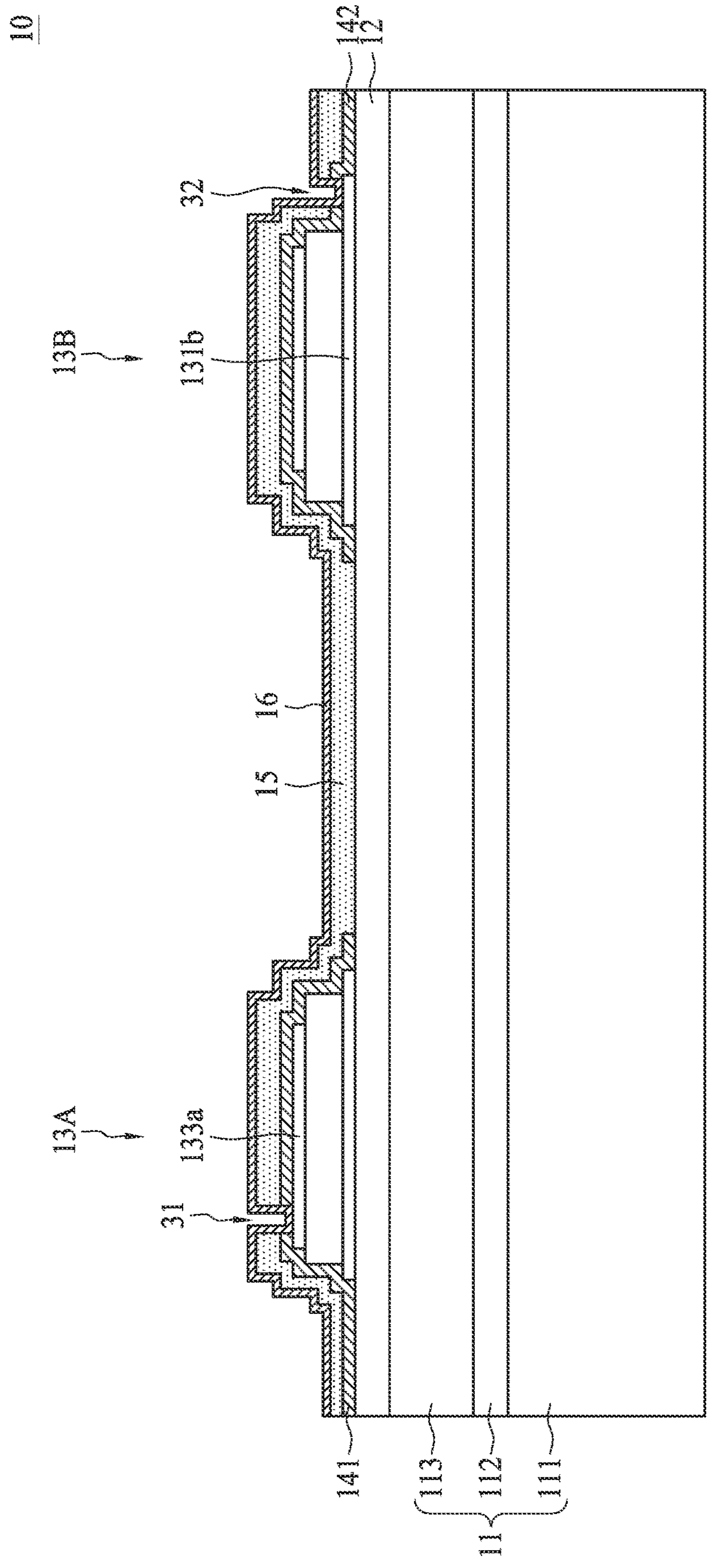

Please refer to FIG. 10, which is a schematic cross-sectional diagram of the semiconductor structure 10 at a stage of the method 600 and/or the method 700 in accordance with some embodiments of the present disclosure. In the operation 602 and/or prior to the operation 702, an intermediate layer 16 is formed over the piezoelectric capacitors 13A and 13B. In some embodiments, the intermediate layer 16 is a metal-containing layer or a conductive layer for providing electrical connection. In some embodiments, the intermediate layer 16 serves as a diffusion barrier layer. In some embodiments, the intermediate layer 16 includes titanium (Ti), tungsten-titanium (TiW), titanium nitride (TiN), tantalum (Ta), tungsten (W), nickel (Ni), gold (Au), chromium (Cr), ruthenium (Ru), indium tin oxide (ITO), or a combination thereof. The intermediate layer 16 may be formed by a conformal deposition, an electron-beam physical vapor deposition (EBPVD), a sputtering operation, an electroplating operation, a screen printing operation, or other suitable method. The intermediate layer 16 may line the opening 31 and the opening 32. In some embodiments, the intermediate layer 16 is conformal to a profile of the opening 31 and a profile of the opening 32. The intermediate layer 16 may contact metallic surfaces of different piezoelectric capacitors at different elevations. In some embodiments, the intermediate layer 16 contacts the top electrode 133*a* of the piezoelectric capacitor 13A. In some embodiments, the intermediate layer 16 contacts the bottom electrode 131*b* of the piezoelectric capacitor 13B. In some embodiments, the intermediate layer 16 contacts the high-k layers 141 and 142. In some embodiments, the intermediate layer 16 contacts the dielectric layer 15 on the sidewalls of the openings 31 and 32. In some embodiments, a thickness of the intermediate layer 16 is in a range of 10 to 200 nanometers (nm).

Figure 11:
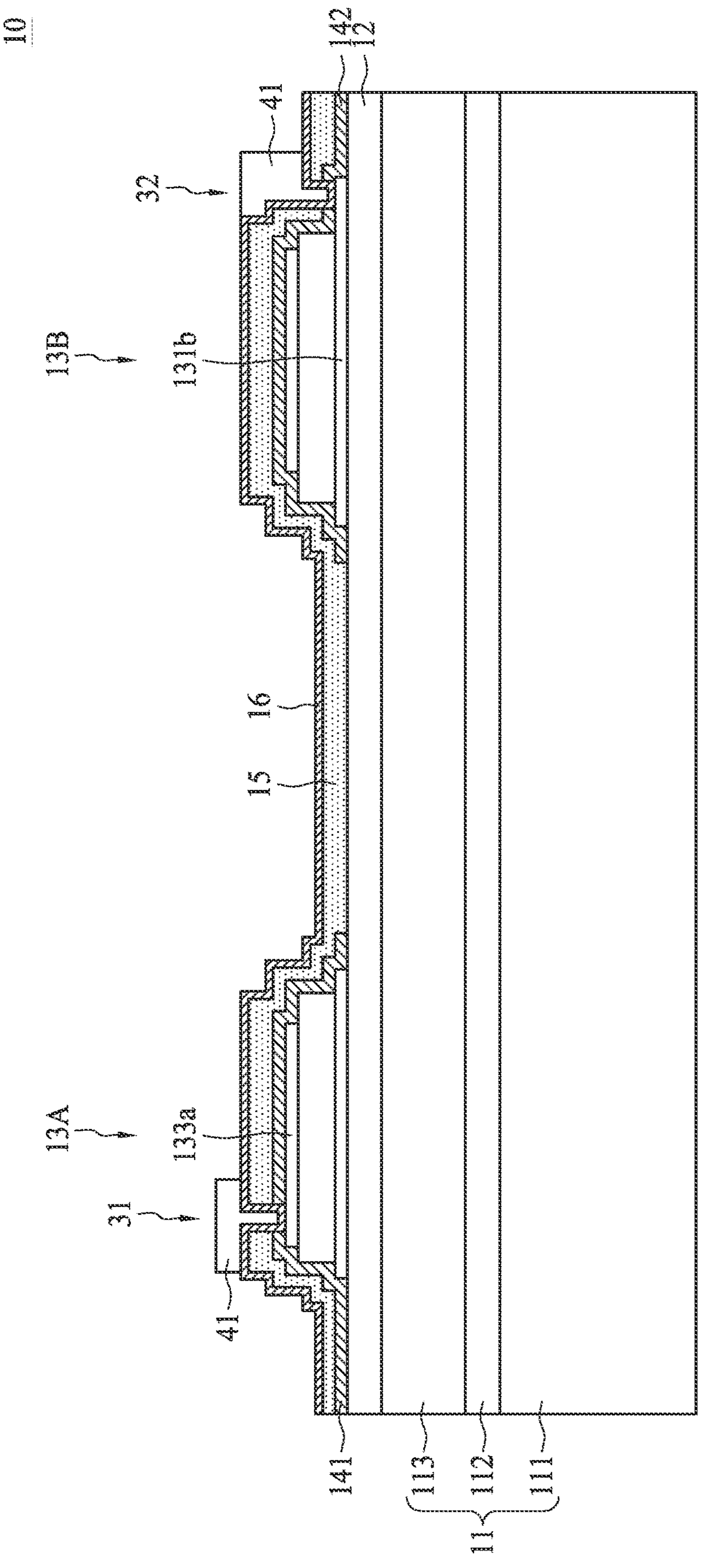
Figure 12:
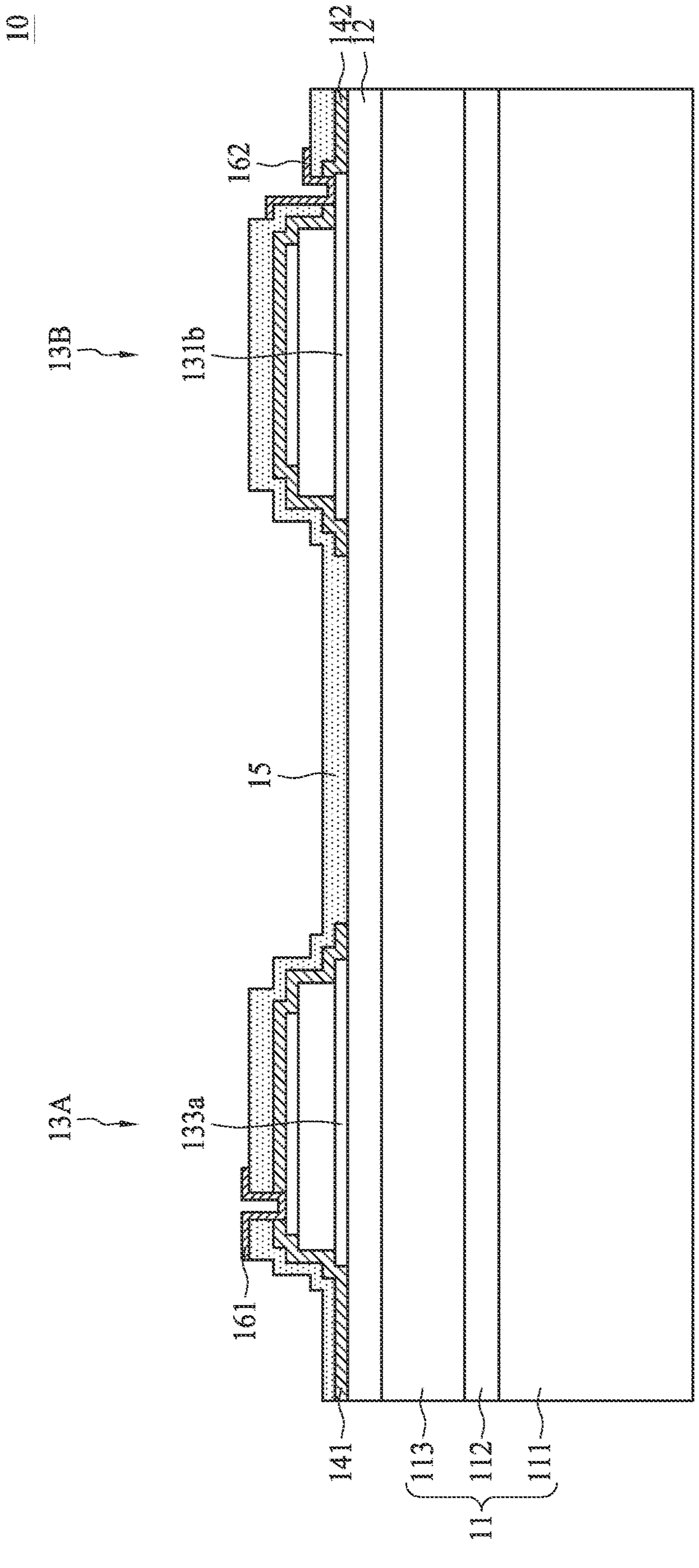

Please refer to FIGS. 11 to 12, which are schematic cross-sectional diagrams of the semiconductor structure 10 at different stages of the method 600 and/or the method 700 in accordance with some embodiments of the present disclosure. In the operation 603 and/or the operation 702, the intermediate layer 16 is patterned using a mask layer 41 as a mask as shown in FIG. 11, and an intermediate segment 161 and an intermediate segment 162 are thereby formed as shown in FIG. 12. In some embodiments, the mask layer 41 includes photoresist material, dielectric material, or other suitable hard mask material. In some embodiments as shown in FIG. 11, the mask layer 41 is formed over the intermediate layer 16. In some embodiments, the mask layer 41 covers as least an entirety of the intermediate layer 16 at the bottom of the openings 31 and 32. In some embodiments, the mask layer 41 covers at least an entirety of the intermediate layer 16 in the openings 31 and 32. The intermediate layer 16 may then be patterned, and the intermediate layer 16 exposed through the mask layer 41 is removed as shown in FIG. 12. The patterning of the intermediate layer 16 may include a dry etching operation, a wet etching operation or a combination thereof. The mask layer 41 is removed after the patterning of the intermediate layer 16.

The mask layer 41 may define configurations of the intermediate segments 161 and 162. In some embodiments, the intermediate segment 161 at least covers a portion of the metallic surface of the piezoelectric capacitor 13A exposed through the high-k layer 141 and the dielectric layer 15. In some embodiments, the intermediate segment 162 at least covers a portion of the metallic surface of the piezoelectric capacitor 13B exposed through the high-k layer 142 and the dielectric layer 15. In some embodiments, the exposed metallic surfaces of the piezoelectric capacitors 13A and 13B are at different elevations. In some embodiments, the intermediate segments 161 and 162 are also at different elevations. In some embodiments, the intermediate segment 161 and the intermediate segment 162 each cover a portion of the dielectric layer 15 outside the openings 31 and 32. In some embodiments, the intermediate segment 161 lines an entirety of inner surfaces of the opening 31. In other words, the intermediate segment 161 lines an inner sidewall and a bottom surface of the opening 31. In some embodiments, the intermediate segment 161 contacts the high-k layer 141, the dielectric layer 15 and the top electrode 133*a* of the piezoelectric capacitor 13A. In some embodiments, the intermediate segment 162 lines an entirety of inner surfaces of the opening 32. In other words, the intermediate segment 162 lines an inner sidewall and a bottom surface of the opening 32. In some embodiments, the intermediate segment 162 contacts the high-k layer 142, the dielectric layer 15 and the bottom electrode 131*h* of the piezoelectric capacitor 13B. The mask layer 41 is removed after the patterning of the intermediate layer 16.

Figure 13A:
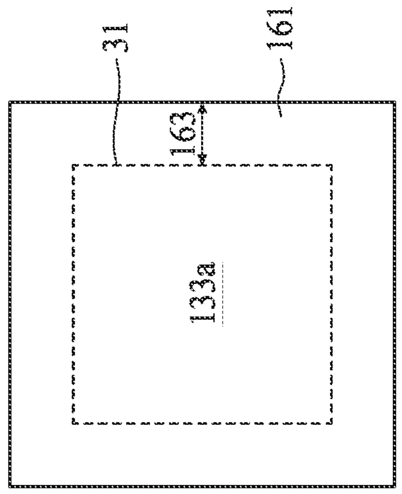
FIGS. 13A, 13B, 13C and 14 are schematic top-view perspectives of one or more openings and an intermediate segment in accordance with different embodiments of the disclosure.
Figure 13B:
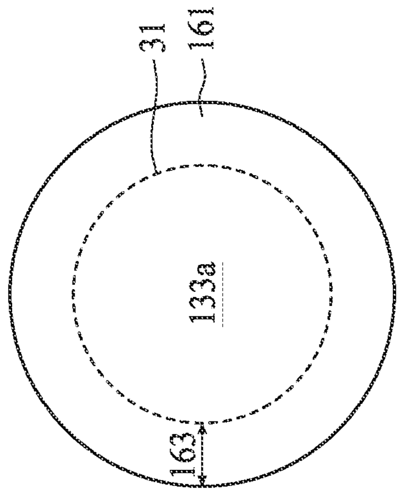
Figure 13C:
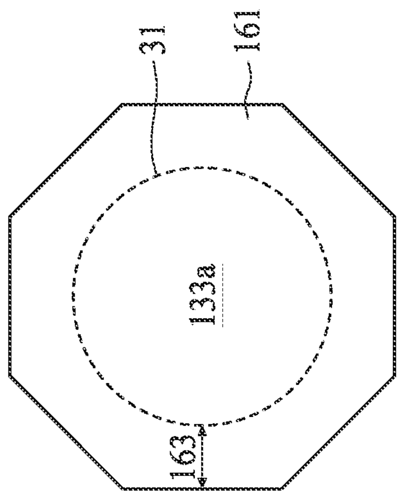

Please refer to FIGS. 13A to 13C, which are schematic top-view perspectives of the opening 31 and the intermediate segment 161 shown in FIG. 12 in accordance with different embodiments of the present disclosure. In some embodiments, the intermediate segment 161 or 162 surrounds the corresponding opening 31 or 32 from a top-view perspective. The intermediate segment 161 and the opening 31 are depicted in FIGS. 13A to 13C for a purpose of illustration. The intermediate segment 162 and the opening 32 can be similar to the intermediate segment 161 and the opening 31, and the repeated description is omitted herein. In some embodiments as shown in FIG. 13A, the intermediate segment 161 having a rectangular configuration covers the opening 31 having a rectangular configuration. In some embodiments, the intermediate segment 161 protrudes from the opening 31 from a top-view perspective. A distance 163 between an edge of the intermediate segment 161 and a sidewall of the dielectric layer 15 or the high-k layer 141, 142 is in a range of 2 to 200 μm. In some embodiments, the distance 163 is a minimum distance between the edge of the intermediate segment 161 and the sidewall of the dielectric layer 15 or the high-k layer 141, 142 for complying with a design rule. FIGS. 13B and 13C provides different configurations of the opening 31 and the intermediate segment 161 according to different embodiments. The opening 31 can be circular, as shown in FIGS. 13B and 13C, and the intermediate segment 161 can be a circle or a polygon (e.g., a hexagon) from a top-view perspective.

Figure 14:
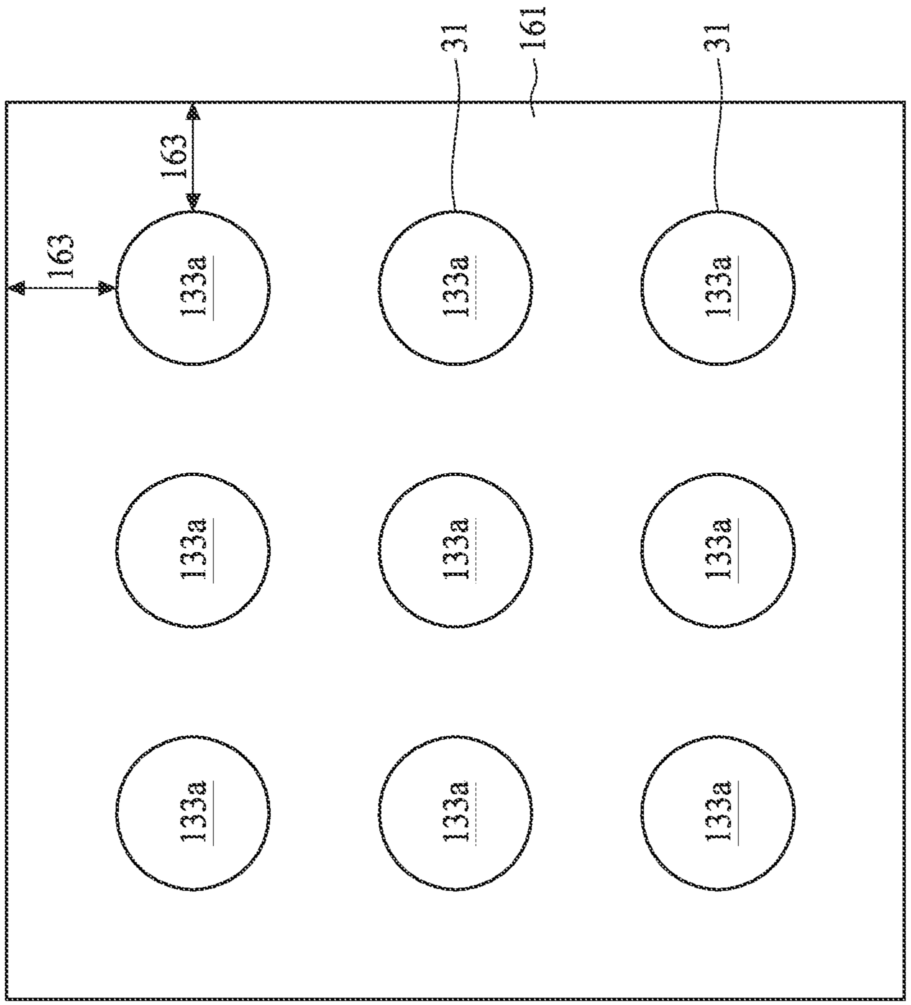

Please refer to FIG. 14, which is a schematic top-view perspective of the openings 31 and the intermediate segment 161 in accordance with another embodiment of the present disclosure. In the embodiments shown in FIGS. 13A to 13C, one intermediate segment 161 covers one corresponding opening 31. However, the intermediate segment 161 can cover more than one opening 31. As described above, a number of the openings 31 formed over an electrode of a piezoelectric capacitor can be greater than one. In the embodiment as shown in FIG. 14, a plurality of openings 31 are formed over the piezoelectric capacitor 13A, exposing portions of the top electrode 133*a*. One intermediate segment 161 may cover some or all of the openings 31 over the top electrode 133*a* of the piezoelectric capacitor 13A. In some embodiments as shown in FIG. 14, one square intermediate segment 161 covers a plurality of circular openings 31. However, configurations of the openings 31 and the intermediate segment 161 are not limited herein.

Figure 15:
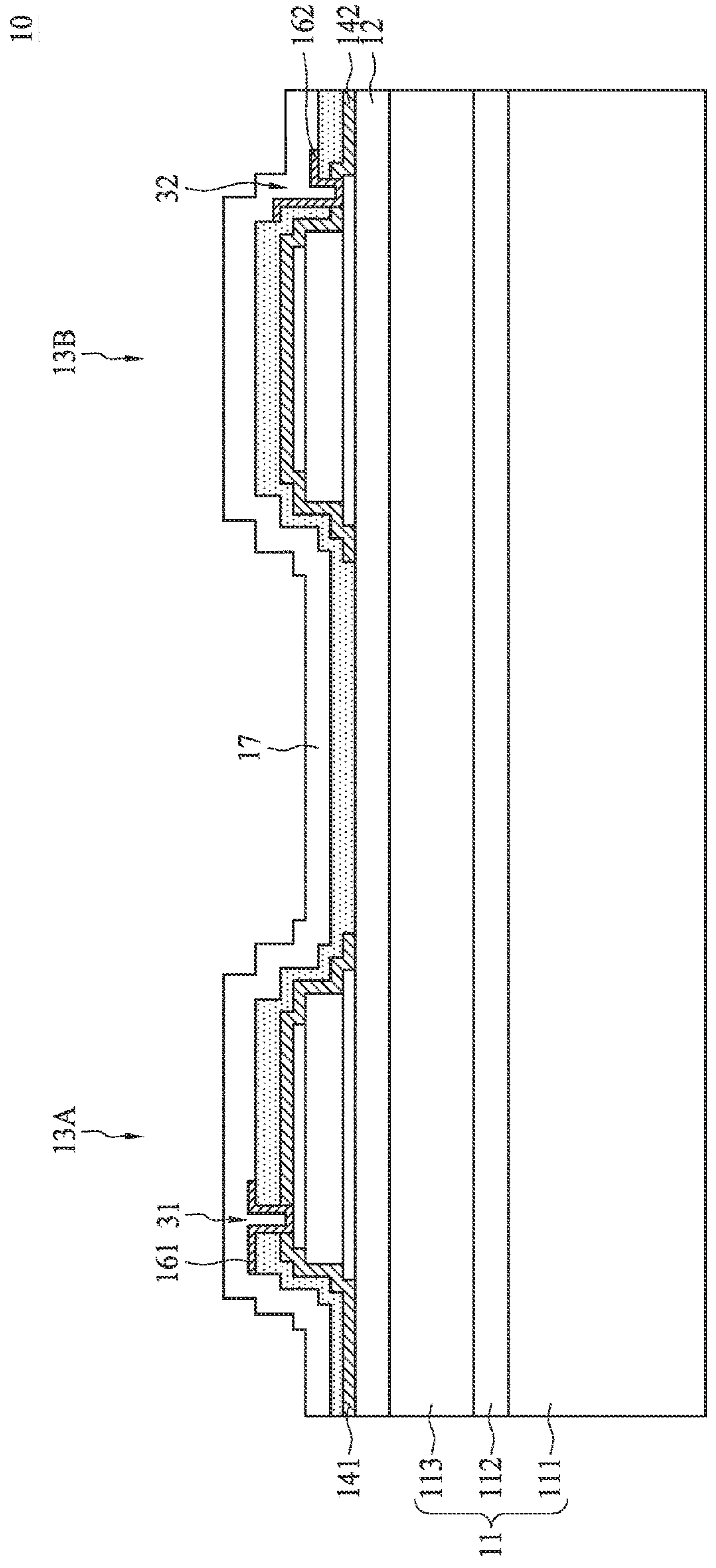
FIGS. 15 to 17 are schematic diagrams at different stages of a method for manufacturing a semiconductor structure in accordance with different embodiments of the disclosure.

Please refer to FIG. 15, which is a schematic cross-sectional diagram of the semiconductor structure 10 at a stage of the method 600 and/or the method 700 in accordance with some embodiments of the present disclosure. In the operation 604 and/or prior to the operation 703, a conductive layer 17 is formed over the substrate 11 and covers the intermediate segments 161 and 162. In some embodiments, the conductive layer 17 is conformal to a profile of the piezoelectric capacitors 13A and 13B and the substrate 11. In some embodiments, the conductive layer 17 fills the openings 31 and 32. In some embodiments, the conductive layer 17 includes one or more metals. In some embodiments, the conductive layer 17 includes aluminum (Al), copper (Cu), gold (Au), chromium (Cr) or a combination thereof. In some embodiments, the conductive layer 17 is configured to form an intermetallic compound with the first metal layer 131 and/or the second metal layer 133. In some embodiments, the intermediate segments 161 and 162 are configured to prevent formation of the intermetallic compound between the conductive layer 17 and an electrode (e.g., 133*a* or 131*b*) of a piezoelectric capacitor (e.g., HA or 13B). In some embodiments, the conductive layer 17 contacts the intermediate segments 161 and 161, especially in the openings 31 and 32. In some embodiments, the intermediate segments 161 and 161 separate the metallic surfaces of the piezoelectric capacitors 13A and 13B from the conductive layer 17. In some embodiments, the conductive layer 17 is formed by an electron-beam physical vapor deposition (EBPVD), a sputtering operation, an electroplating operation, a screen printing operation, or other suitable method. In some embodiments, a thickness of the conductive layer 17 is in a range of 100 nm to 10 μm.

Figure 16:
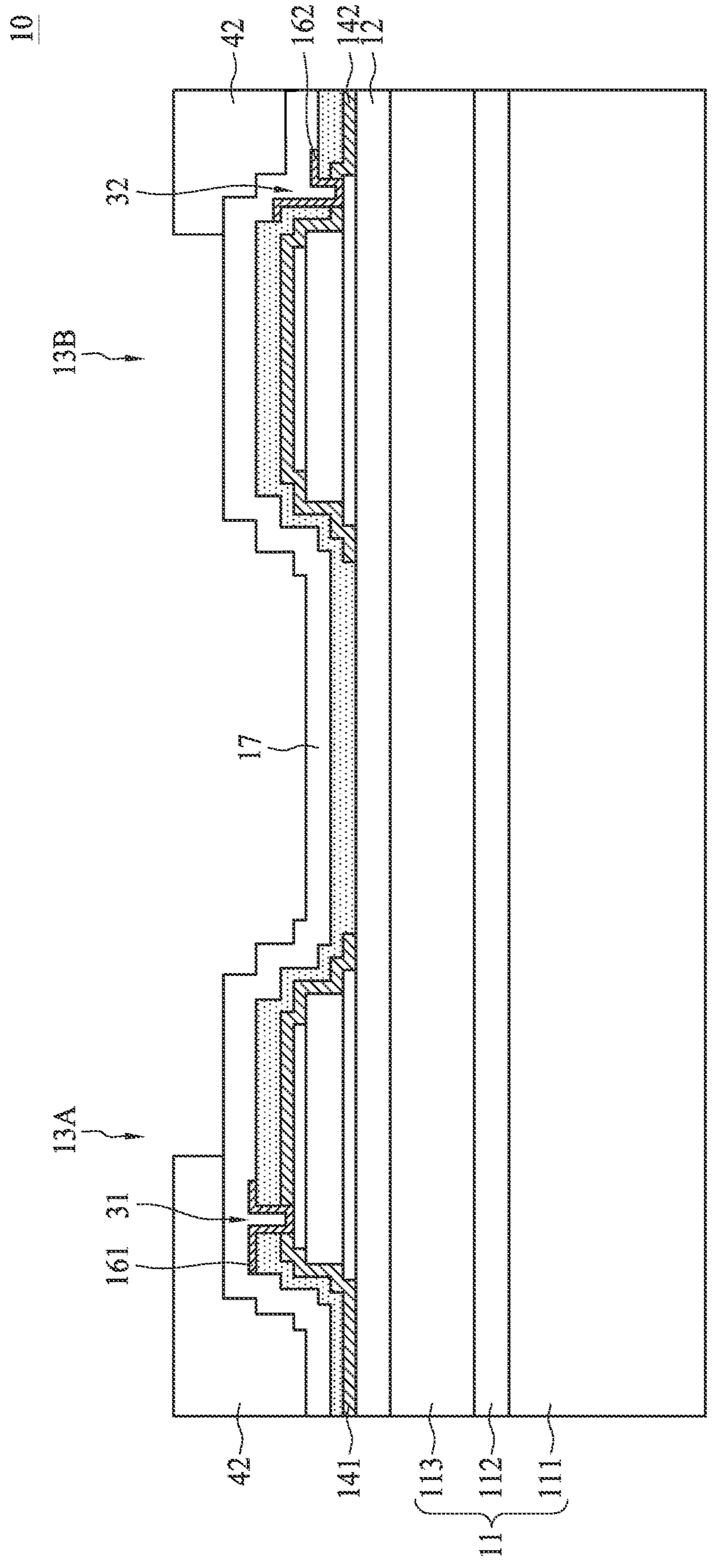
Figure 17:
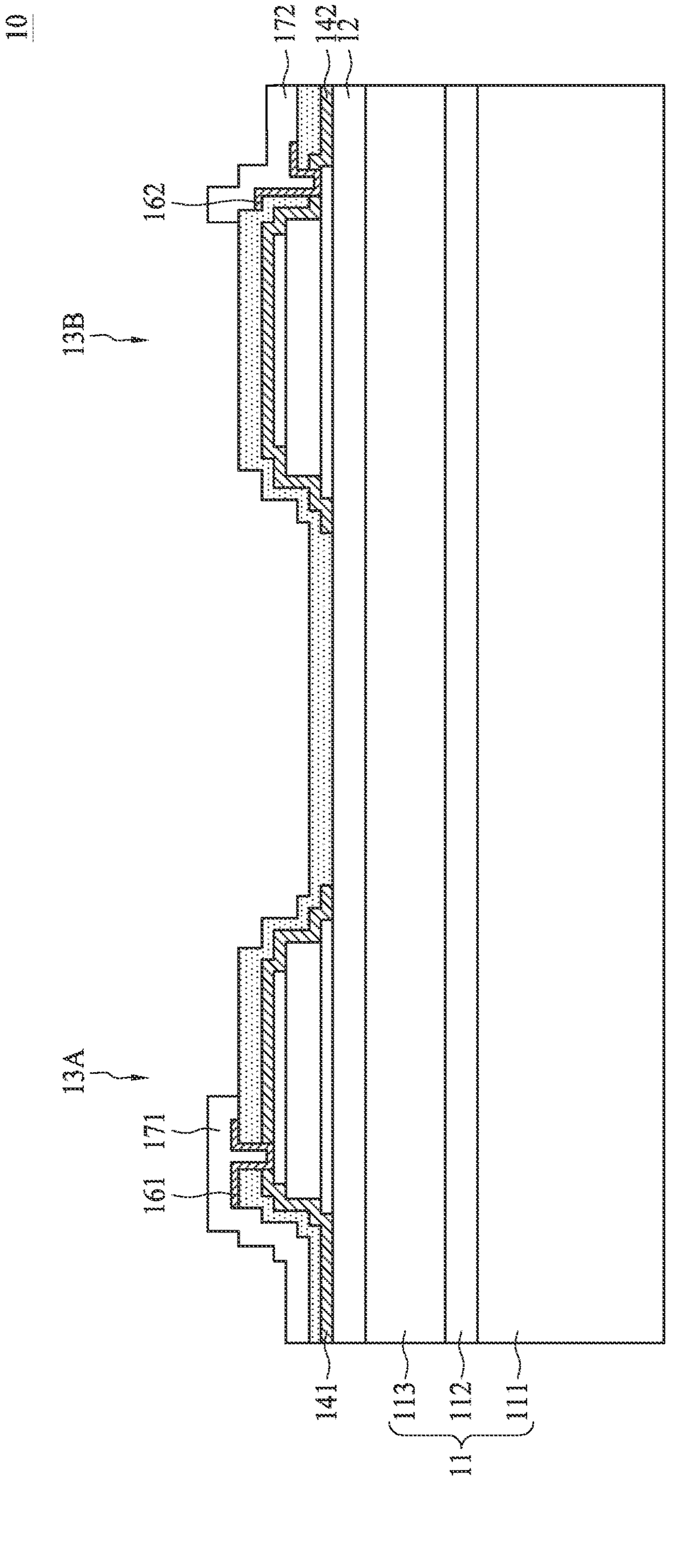

Please refer to FIGS. 16 to 17, which are schematic cross-sectional diagrams of the semiconductor structure 10 at different stages of the method 600 and/or the method 700 in accordance with some embodiments of the present disclosure. In the operation 605 and/or the operation 703, the conductive layer 17 is patterned using a mask layer 42 as a mask as shown in FIG. 16, and conductive segments 171 and 172 are thereby formed as shown in FIG. 17. In some embodiments as shown in FIG. 16, the mask layer 42 is formed over the conductive layer 17. In some embodiments, the mask layer 42 vertically covers as least an entirety of the intermediate segments 161 and 162. The intermediate layer 16 may then be patterned, and the conductive layer 17 exposed through the mask layer 42 is removed as shown in FIG. 17. In some embodiments, the mask layer 42 includes a photoresist material, a dielectric material, or other suitable hard mask material. The patterning of the conductive layer 17 may include a dry etch, a wet etch or a combination thereof. The mask layer 42 may define configurations of the conductive segments 171 and 172. The conductive segments 171 and 172 can be smaller than, equal in size to, or larger than the intermediate segments 161 and 162, respectively, from a top-view perspective, depending on different applications.

If a wet etching operation is performed during the patterning of the conductive layer 17, the intermediate segments 161 and 162 are within coverage areas of the conductive segments 171 and 172, respectively, as shown in FIG. 17. In some embodiments, the conductive segment 171 overlaps the entire intermediate segment 161. In some embodiments, the conductive segment 171 covers an entirety of the intermediate segment 161. In some embodiments, the conductive segment 172 entirely overlaps the intermediate segment 162 or covers an entirety of the intermediate segment 162. In some embodiments, an edge of the conductive segment 171 protrudes farther than the intermediate segment 161. In some embodiments, an edge of the conductive segment 172 protrudes farther than the intermediate segment 162. The mask layer 42 is removed after the patterning of the conductive layer 17.

Figure 18:
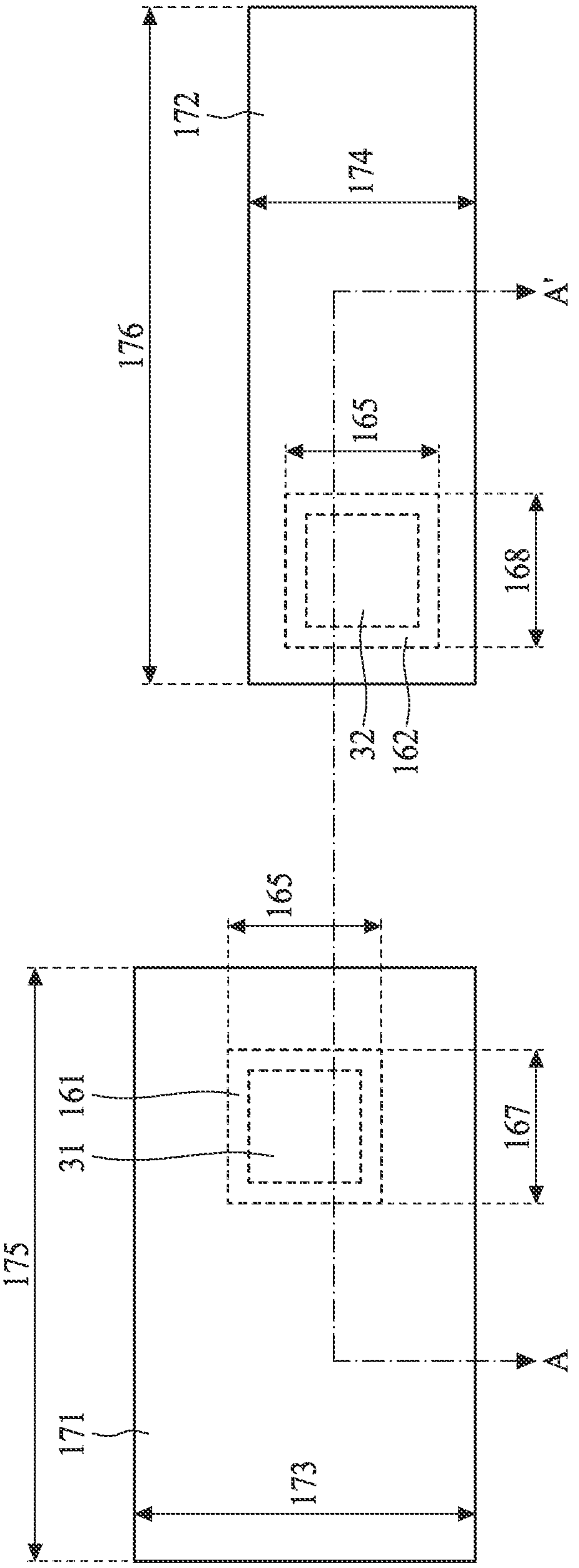
FIG. 18 is a schematic top-view perspective of different elements in accordance with some embodiments of the disclosure.

Please refer to FIG. 18, which is a schematic top-view perspective of the openings 31 and 32, the intermediate segments 161 and 162, and the conductive segments 171 and 172 in accordance with the embodiments shown in FIG. 17. In some embodiments, an edge of the conductive segment 171 protrudes from the intermediate segment 161 from the top-view perspective. In some embodiments, an edge of the conductive segment 172 protrudes from the intermediate segment 162 from the top-view perspective. In some embodiments, a sidewall of each of the conductive segments (e.g., 171 and 172) encircles a corresponding intermediate segment (e.g., 161 or 162). In some embodiments, a width 173 of the conductive segment 171 is greater than a width 165 of the intermediate segment 161, wherein the width 173 and the width 165 are measured along a same direction. In some embodiments, the width 173 and the width 165 are measured along a virtual straight line (not shown in the figures). In some embodiments, a length 175 of the conductive segment 171 is greater than a length 167 of the intermediate segment 161, wherein the length 175 and the length 167 are measured along a same direction. In some embodiments, the length 175 and the length 167 are measured along a virtual straight line (not shown in the figures). In addition, since the first mask layer 41 defines the intermediate segments 161 and 162 and the second mask layer 42 defines the conductive segments 171 and 172, a top view of the first mask layer 41 is similar to or equivalent to the top view of the intermediate segments 161 and 162, and a top view of the second mask layer 42 is similar to or equivalent to the top view of the conductive segments 171 and 172 as shown in FIG. 18. In some embodiments, a width or a length of the second mask layer 42 is greater than a width or a length of the first mask layer 41 from top views at different stages.

Figure 19:
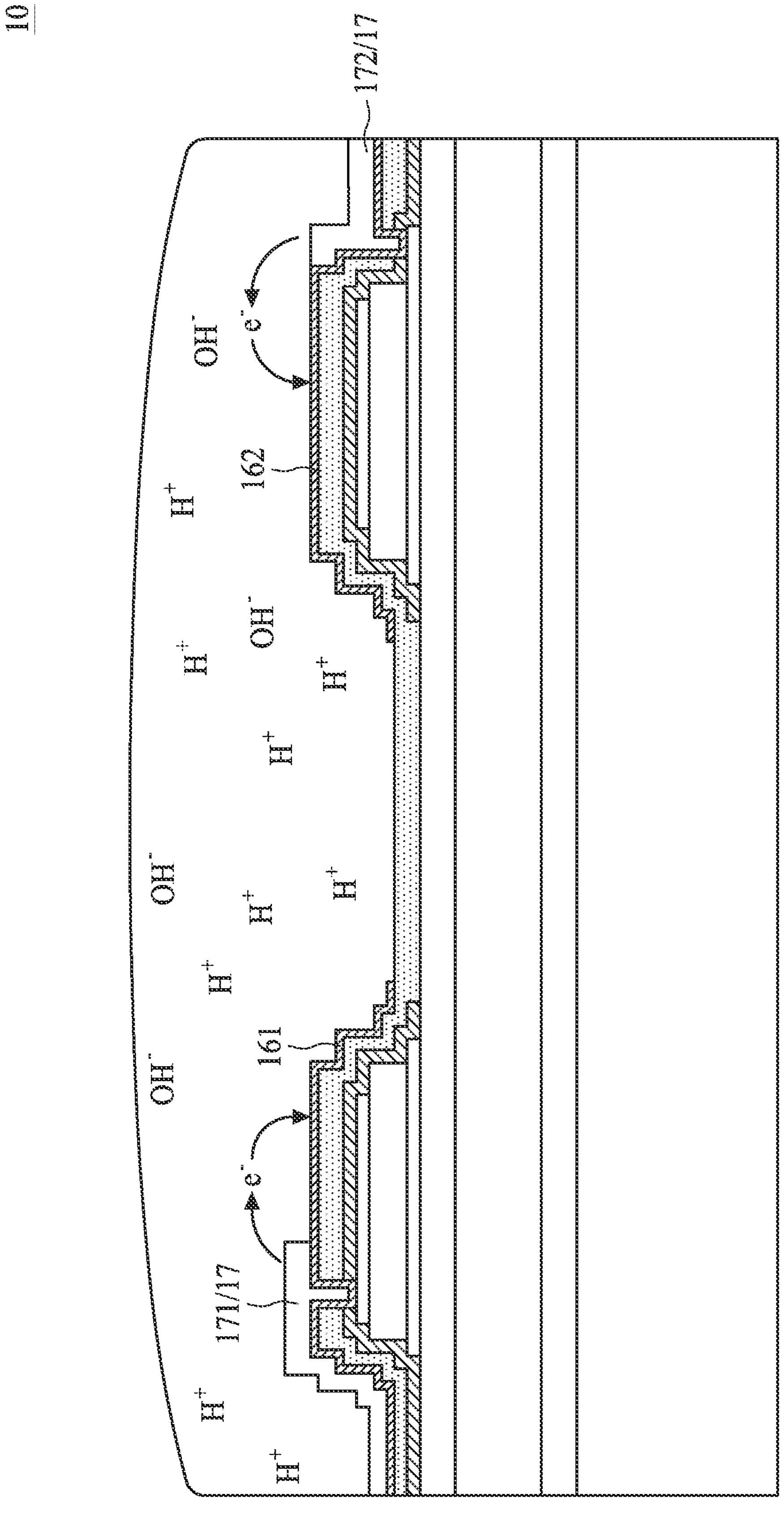
FIG. 19 is a schematic diagram illustrating a mechanism of galvanic corrosion during a wet etching operation performed on a conductive layer in accordance with some embodiments of the disclosure.

FIG. 19 is a schematic diagram illustrating a mechanism of galvanic corrosion that may occur during a wet etching operation performed on the conductive layer 17. In some embodiments, a mask layer different from the first mask layer 41 is used to define the intermediate segments 161 and 162, and the intermediate segments 161 and 162 are exposed through the conductive layer 17 during the wet etch. In some embodiments, the conductive layer 17 includes a metal having an absolute electrode potential different from that of a metal of the intermediate layer 16. An etchant solution of the wet etch may act as an electrolyte solution and facilitate electrochemical reaction between the two metals of the conductive layer 17 and the intermediate layer 16, which results in galvanic corrosion between the conductive layer 17 and the intermediate layer 16. Precipitation may occur outside a designed position of an intermediate segment (e.g., 161 or 162) or a conductive segment (e.g., 171 or 172). A difference between the absolute electrode potentials of the conductive layer 17 and the intermediate layer 16 greater than 0.2 $E^0$(V) is likely to result in galvanic corrosion. In some embodiments, as shown as an exemplary illustration in FIG. 18, the conductive layer 17 includes aluminum, the intermediate layer 16 includes titanium, and an acidic etchant is used in the wet etch. The conductive layer 17 acts as a cathode, and the intermediate layer 16 acts as an anode, and thus, precipitate of aluminum from the conductive layer 17 is formed outside a designed area, and a mouse bite defect or an uneven boundary is found on the conductive segments 171 and 172. For a purpose of preventing the mouse bite defect and the galvanic corrosion, the conductive segments 171 and 172 are designed to cover an entirety of the intermediate segments 161 and 162, and thus the intermediate segments 161 and 162 can be kept separate from the etchant during the wet etching operation. In some embodiments, the width 173 or the width 174 is in a range of 1 μm to 1 millimeter (mm).

In contrast, the mouse bite defect and the galvanic corrosion would not occur if a dry etching operation is performed during the patterning of the conductive layer 17, and thus portions of the intermediate segments 161 and 162 can protrude from the conductive segments 171 and 172, respectively, from a top-view perspective. Configurations of the intermediate segments 161 and 162 and the conductive segments 171 and 172 can adjusted according to different applications, and are not limited herein. In some embodiments, at least one of the intermediate segments 161 and 162 protrudes from the corresponding conductive segment 171 and/or 172 from a top-view perspective during the dry etching operation. In some embodiments, the intermediate layer 16 is patterned together with the conductive layer 17. In some embodiments, a width or a length of an intermediate segment (e.g., 161 or 162) is greater than a width or a length of a conductive segment (e.g., 171 or 172). In some embodiments, the width 173 or the width 174 is in a range of 1 μm to 1 mm.

Figure 20:
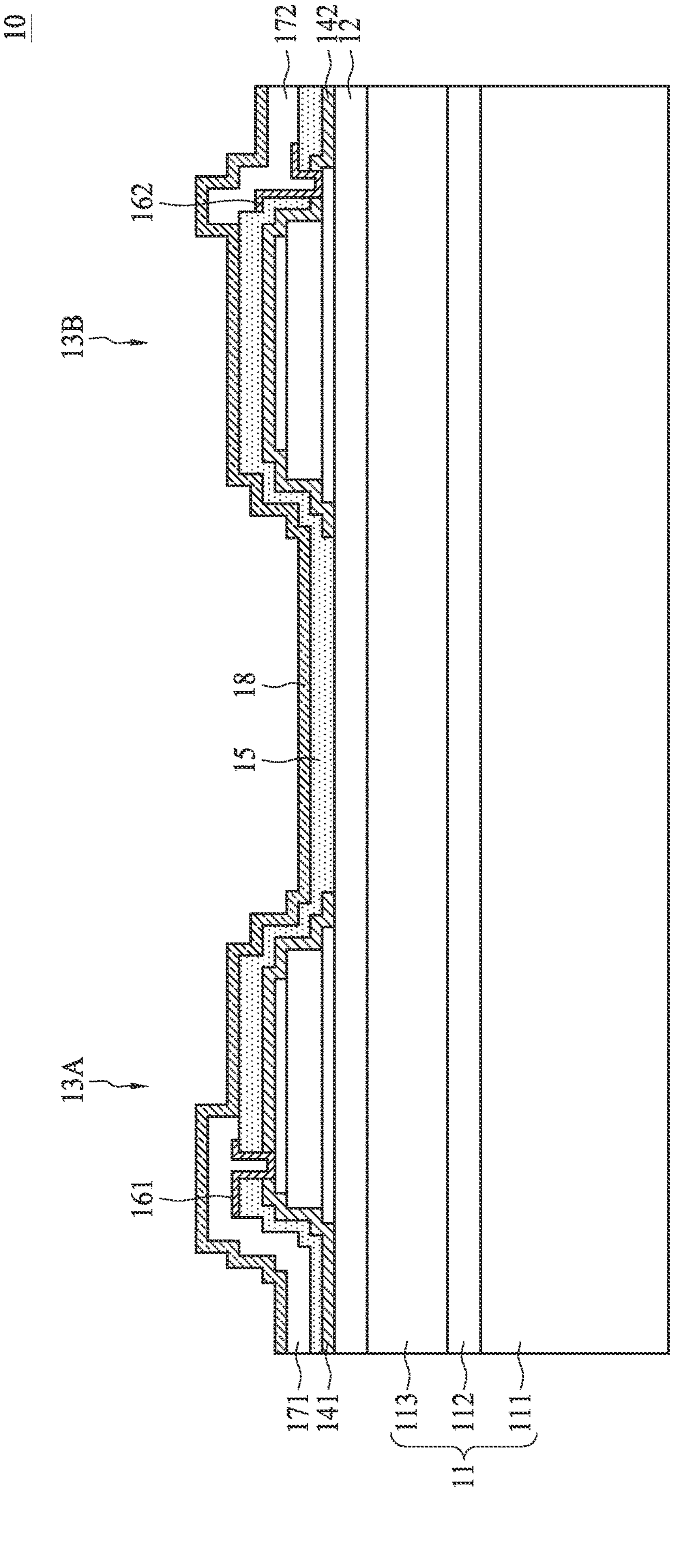
FIGS. 20 to 26 are schematic diagrams at different stages of a method for manufacturing a semiconductor structure in accordance with different embodiments of the disclosure.
Figure 21:
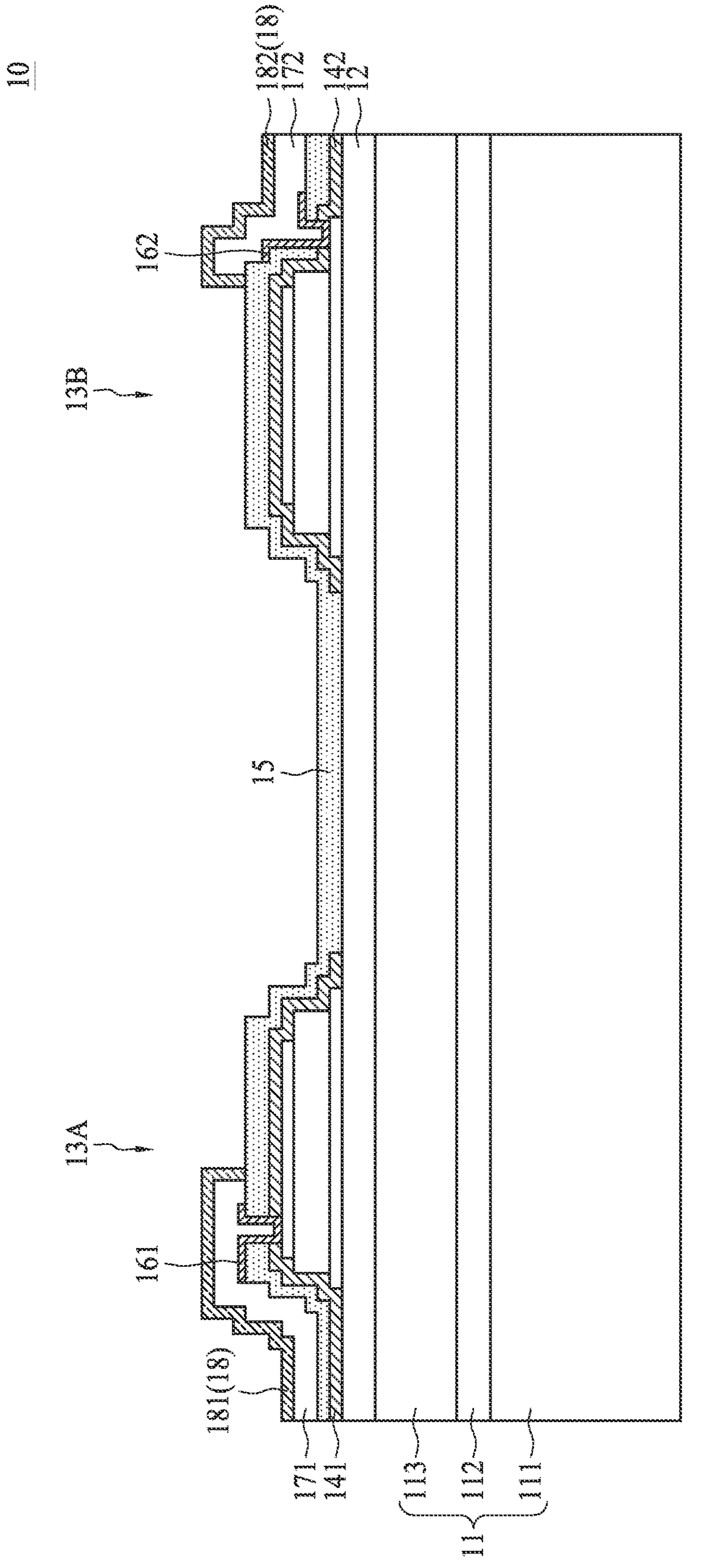

Please refer to FIGS. 20 to 21, which are schematic cross-sectional diagrams of the semiconductor structure 10 at different stages of the method 600 and/or the method 700 in accordance with some embodiments of the present disclosure. After the operation 606 and/or prior to the operation 704, a high-k material layer 18 is formed (shown in FIG. 20) and patterned into a high-k layer 181 and a high-k layer 182 (shown in FIG. 21). In some embodiments, the high-k material layer 18 is conformal to a profile of the conductive segments 171 and 172 and the dielectric layer 15. In some embodiments, the high-k layer 181 at least covers the conductive segment 171 and the high-k layer 182 at least covers the conductive segment 172. In some embodiments, the high-k layer 181 covers an entirety of the conductive segment 171 and the high-k layer 182 covers an entirety of the conductive segment 172. A material, formation and the patterning of the high-k material layer 18 can be similar to those of the high-k material layer 14, and the repeated description is omitted herein.

Figure 22:
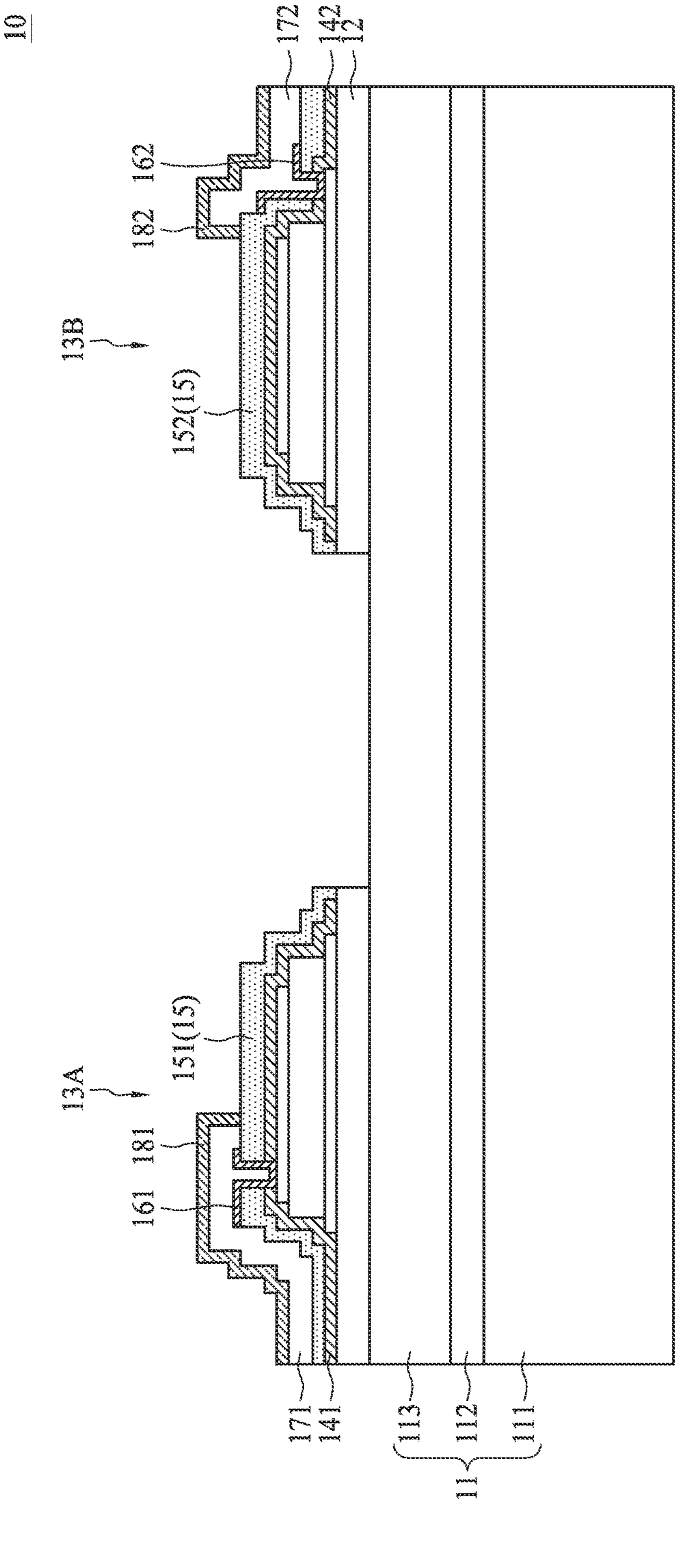

Please refer to FIG. 22, which is a schematic cross-sectional diagram of the semiconductor structure 10 at a stage of the method 600 and/or the method 700 in accordance with some embodiments of the present disclosure. After the formation of the high-k layers 181 and 182, a portion of the substrate 11 between the piezoelectric capacitors 13A and 13B is exposed. More specifically, a portion of the silicon layer 113 of the substrate 11, where a diaphragm of the semiconductor structure 10 is to be formed, is exposed. In some embodiments, a portion of the dielectric layer 12 and a portion of the dielectric layer 15 disposed between and exposed through the high-k layers 141 and 142 are removed. In some embodiments, the dielectric layer 12 and the dielectric layer 15 include a same dielectric material, and the portions of the dielectric layer 12 and the dielectric layer 15 are be removed concurrently. In some embodiments, the exposure of the portion of the substrate 11 includes an ion beam etching, a reactive ion etching, a wet etching, a lift-off operation, or the like. In some embodiments, sidewalls of the high-k layers 141 and 142 proximal to the removed portion of the dielectric layer 12 are covered by remaining portions 151 and 152 of the dielectric layer 15. More specifically, the sidewall of the high-k layer 141 is covered by the portion 151 of the dielectric layer 15, and the sidewall of the high-k layer 142 is covered by the portion 152 of the dielectric layer 15.

Figure 23:
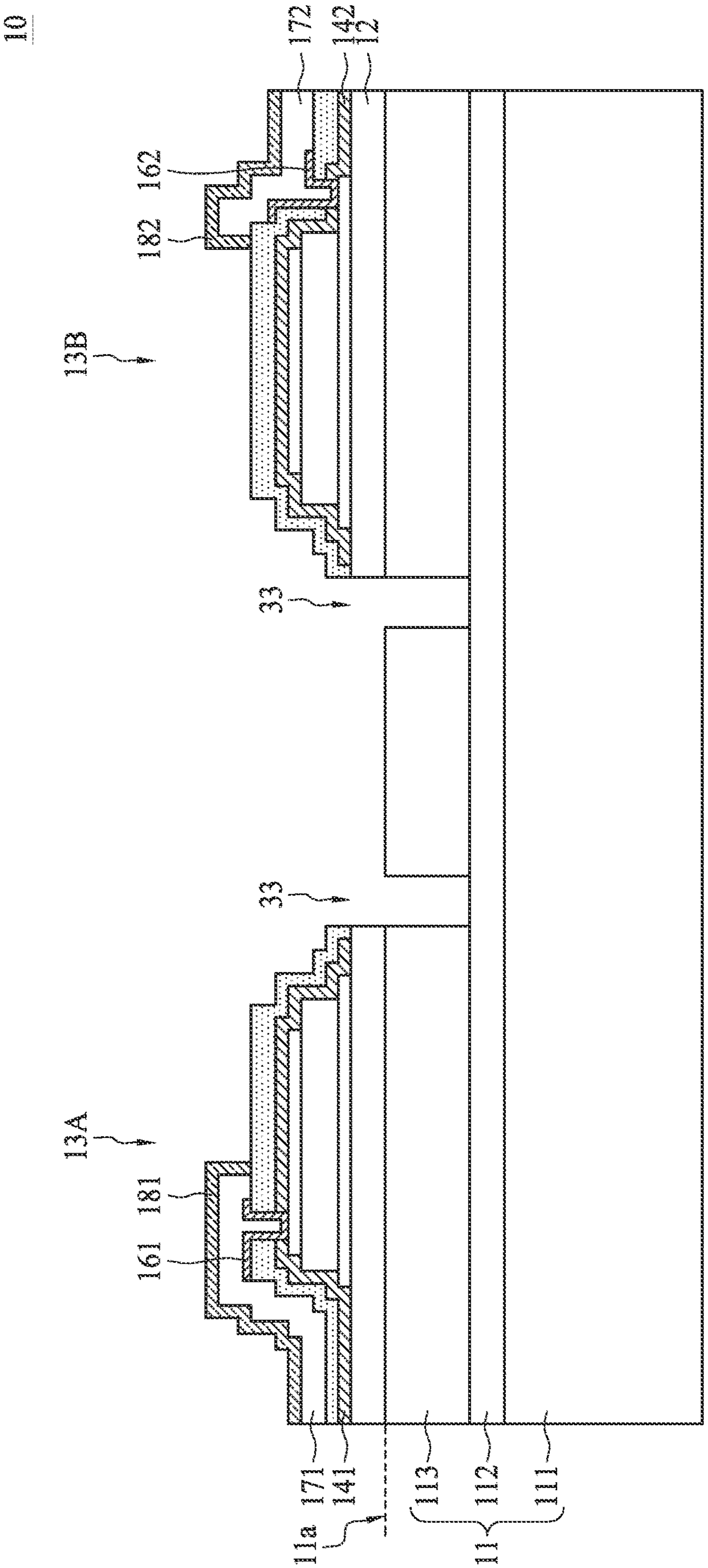

Please refer to FIG. 23, which is a schematic cross-sectional diagram of the semiconductor structure 10 at a stage of the method 600 and/or the method 700 in accordance with some embodiments of the present disclosure. After the exposure of the silicon layer 113 of the substrate 11, one or more openings 33 are formed in the substrate and indented form the first surface 11*a*. In some embodiments, the openings 13 penetrate the silicon layer 113. In some embodiments, a directional dry etch is performed to remove one or more portions of the exposed portion of the silicon layer 113, in some embodiments, one or more surficial portions of the insulator 112 exposed in the openings 33 are also removed. In some embodiments, the openings 33 are formed in a peripheral region of the exposed portion of the silicon layer 113. In some embodiments, at least one of the openings 33 is proximal to a central region of the exposed portion of the silicon layer 113 (not shown).

Figure 24:
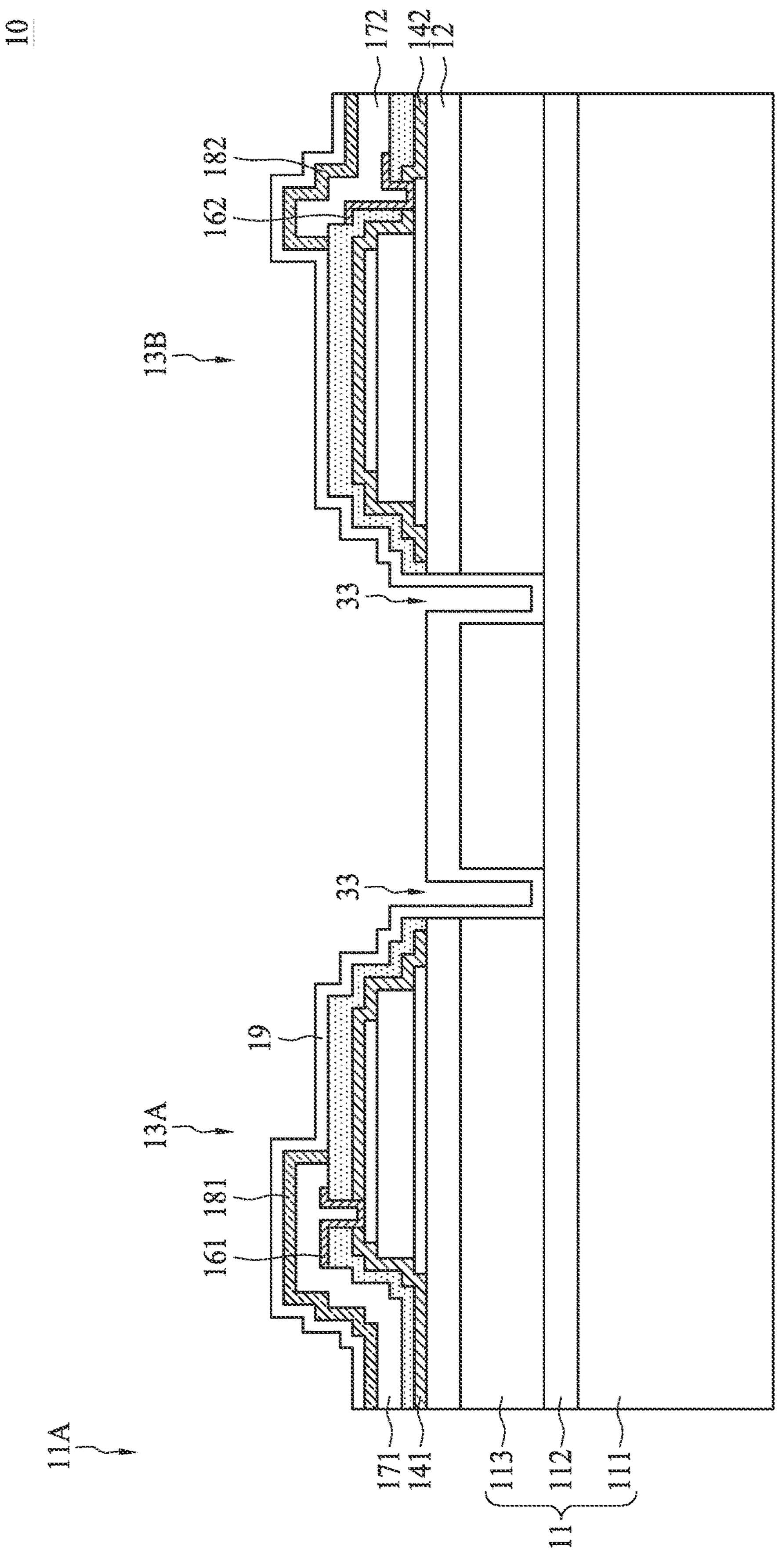

Please refer to FIG. 24, which is a schematic cross-sectional diagram of the semiconductor structure 10 at a stage of the method 600 and/or the method 700 in accordance with some embodiments of the present disclosure. After the formation of the openings 33 or in the operation 704, a passivation layer 19 is conformally formed over the piezoelectric capacitors 13A and 13B and the substrate 11. In some embodiments, a deposition is performed to form the passivation layer 19. The passivation layer 19 may be a dielectric layer. In some embodiments, the passivation layer 19 includes silicon nitride, silicon oxide, silicon oxynitride, other suitable dielectric materials, or a combination thereof. In some embodiments, the passivation layer 19 lines sidewalls and bottom surfaces of the openings 33. In some embodiments, the passivation layer 19 contacts the silicon layer 113 and the insulator 112.

Figure 25:
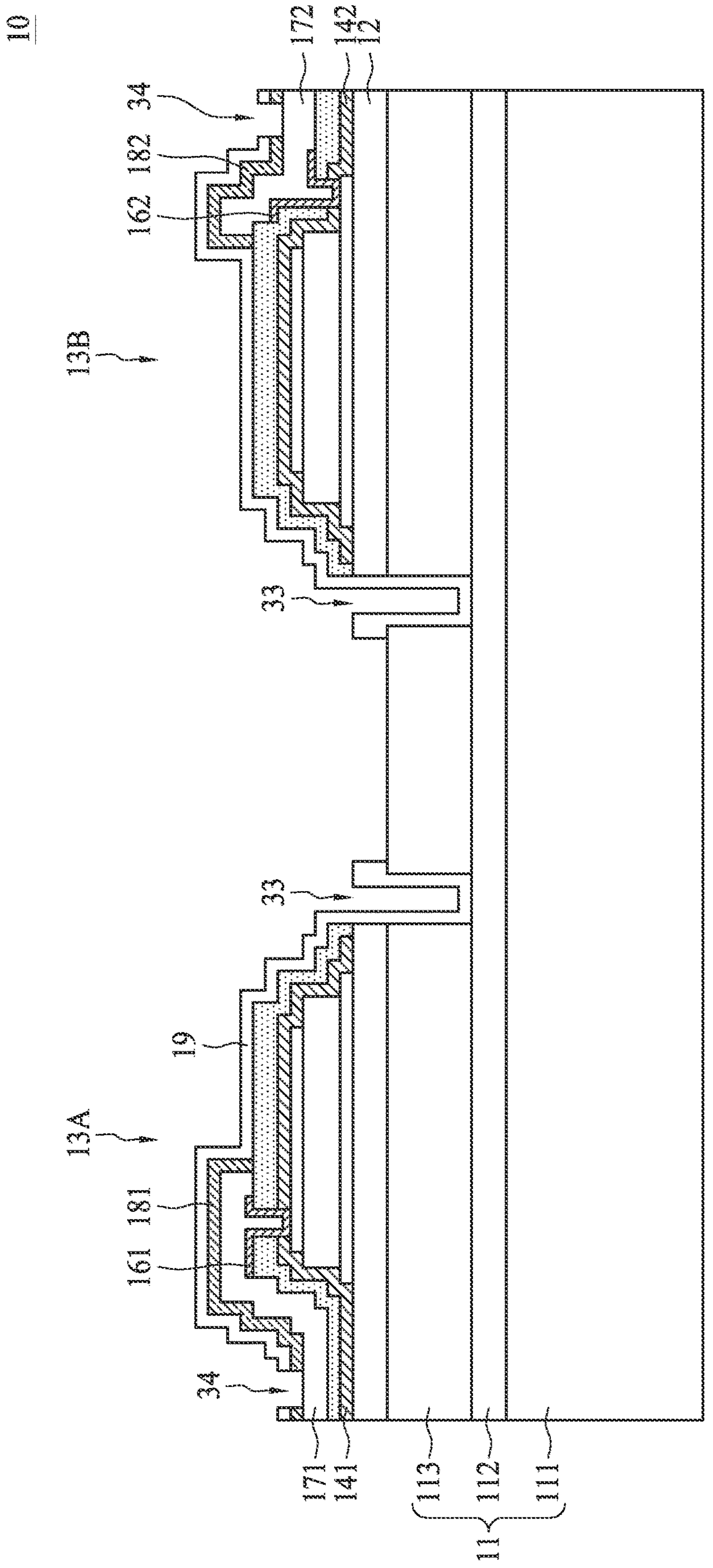

Please refer to FIG. 25, which is a schematic cross-sectional diagram of the semiconductor structure 10 at a stage of the method 600 and/or the method 700 in accordance with some embodiments of the present disclosure. After the formation of the passivation layer 19 or in the operation 705, portions of the conductive segments 171 and 172 are exposed through openings 34. In some embodiments, portions of the high-k layers 181 and 182 and portions of the passivation layer 19 are removed, thereby forming the openings 34. In some embodiments, the exposure of the portions of the conductive segments 171 and 172 includes an ion beam etching, a reactive ion etching, a wet etching, a lift-off operation, or the like. In some embodiments, a portion of the passivation layer 19 between the piezoelectric capacitors 13A and 13B is further removed concurrently with the formation of the openings 34, and a portion of silicon layer 113 is exposed through the passivation layer 19 at where the diaphragm is to be formed later. In some embodiments, the portions of the high-k layers 181 and 182 are removed after the removal of the portions of the passivation layer 19 by a separate etching operation. In some embodiments, the portions of the high-k layers 181 and 182 and the portions of the passivation layer 19 are removed concurrently by the same etching operation. The exposure of the portions of the conductive segments 171 and 172 is for a purpose of electrical connection to other electrical components for transmitting current or voltage. The electrical connection can be achieved by conventional methods according to different applications, and the detailed illustration is omitted herein.

Figure 26:
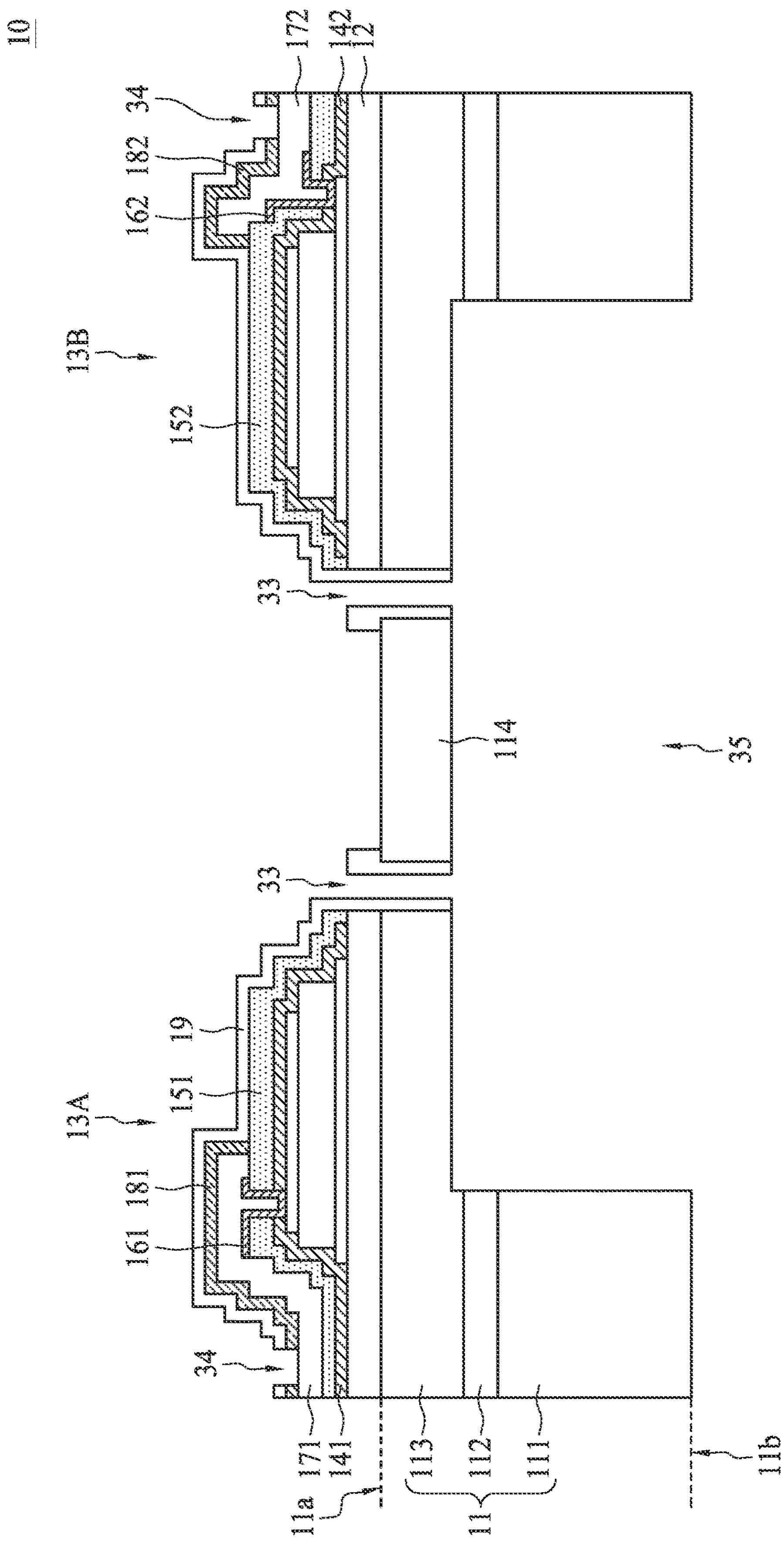

Please refer to FIG. 26, which is a schematic cross-sectional diagram of, the semiconductor structure 10 at a stage of the method 600 and/or the method 700 in accordance with some embodiments of the present disclosure. After the exposure of the conductive segments 171 and 172, a cavity 35 is formed in the substrate 11 and indented from a second surface 11*b* of the substrate 11, wherein the second surface 11*b* is opposite to the first surface 11*a*. In some embodiments, the formation of the cavity 35 includes removal of a portion of the bulk substrate 111 and a portion of the insulator 112. In some embodiments, the removal of the portion of the bulk substrate 111 and the portion of the insulator 112 includes an ion beam etching, a reactive ion etching, a wet etching, or a combination thereof. The cavity 35 may vertically overlap an entirety of the exposed portion of the silicon layer 113. In some embodiments, the cavity 35 overlaps at least part of the piezoelectric capacitor 13A along a vertical direction. In some embodiments, the cavity 35 overlaps at least part of the piezoelectric capacitor 13B along the vertical direction. In some embodiments, formation of the cavity 35 includes removal of a portion of the passivation layer 19 lining the silicon layer 113 at bottoms of the openings 33. As a result, the cavity 35 may be connected to or in fluid communication with the openings 33 for a purpose of air to flow through. In some embodiments, a diaphragm 114 is therefore defined after the formation of the cavity 35. The semiconductor structure 10 can be applied in a speaker and/or other types of actuators. In some embodiments, the diaphragm 114 is surrounded by the passivation layer 19. In some embodiments, the diaphragm 114 is encircled by the passivation layer 19 from a top-view perspective. In some embodiments, the openings 33 surround the diaphragm 114 from the top-view perspective. It should be noted that the exposure of the conductive segments 171 and 172 and/or formation of the electrical connections to the piezoelectric capacitors 13A and 13B can be performed after formation of the cavity 35 as long as the semiconductor structure 10 can be achieved, and are is not limited herein.

The present disclosure provides a method of manufacturing a semiconductor structure including an intermediate layer between two metals configured to form intermetallic compounds. In the present disclosure, the intermediate layer functions as a barrier between a conductive segment and an electrode of the capacitor, and thus formation of intermetallic compounds can be avoided. The otherwise formed intermetallic compounds may adversely affect the performance of the semiconductor structure. In addition, different mask layers are used to define patterns of the intermediate layer and the conductive layer, and thus the intermediate layer is kept physically separate from the etchant solution during a wet etching operation. Galvanic corrosion and precipitation resulting from electrochemical reaction between the intermediate layer and the conductive layer can be prevented, and a defect can thus be prevented as well.

In alternative embodiments as described above, a dry etching operation is performed during the patterning of the conductive layer 17, and the intermediate segments 161 and 162 are exposed through the conductive segments 171 and 172 formed after the patterning operation. FIGS. 27 to 30 are schematic diagrams at different stages of the method 600 and/or the method 700 and from different aspects of a semiconductor structure 20 in accordance with alternative embodiments of the present disclosure. For ease of illustration, reference numerals with similar or same functions and properties are repeatedly used in different embodiments and figures, and for a purpose of brevity, only differences from other embodiments are emphasized in the following specification, and repeated descriptions of similar or same elements, functions and properties are omitted.

Figure 27:
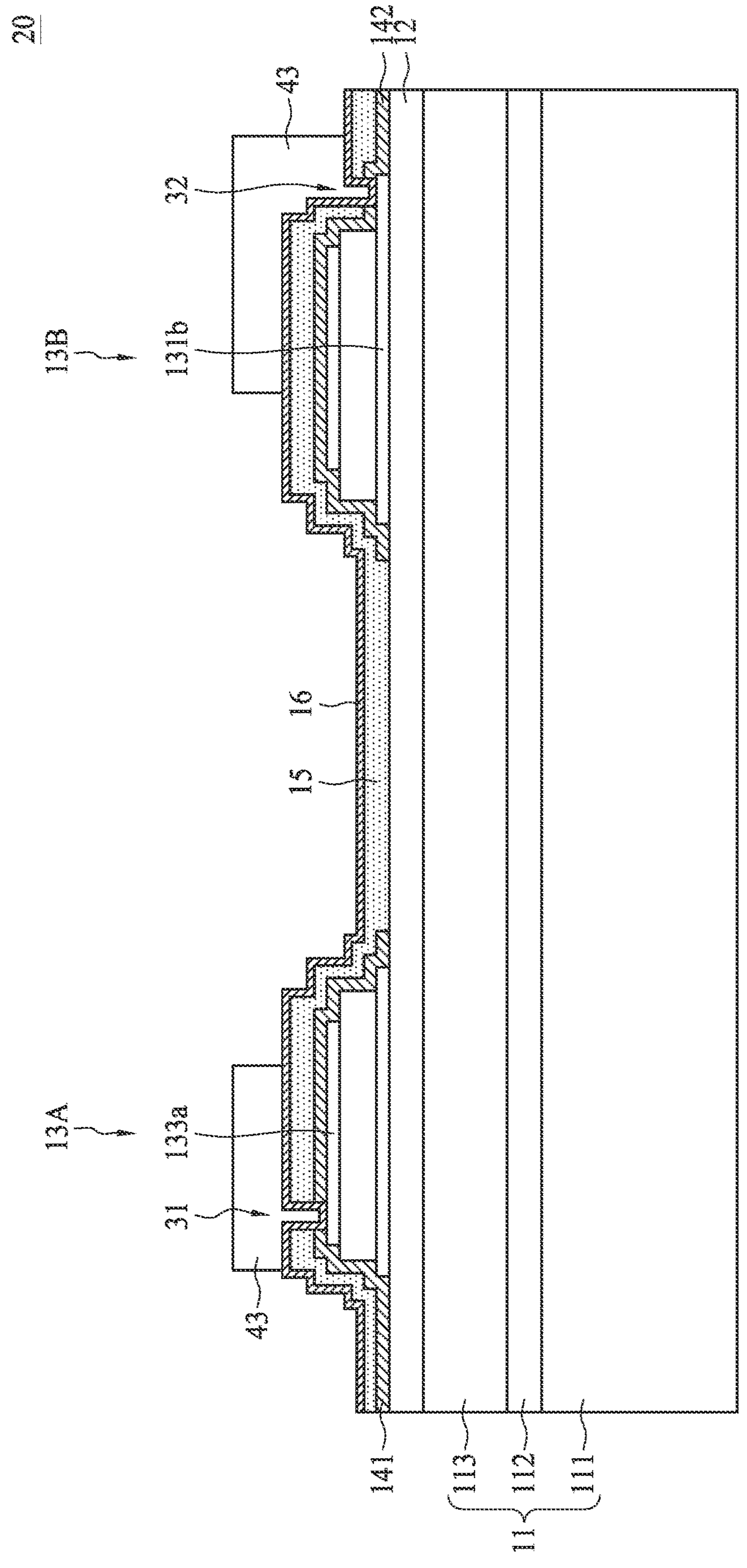
FIGS. 27 to 29 are schematic diagrams at different stages of a method for manufacturing a semiconductor structure in accordance with different embodiments of the disclosure.
Figure 28:
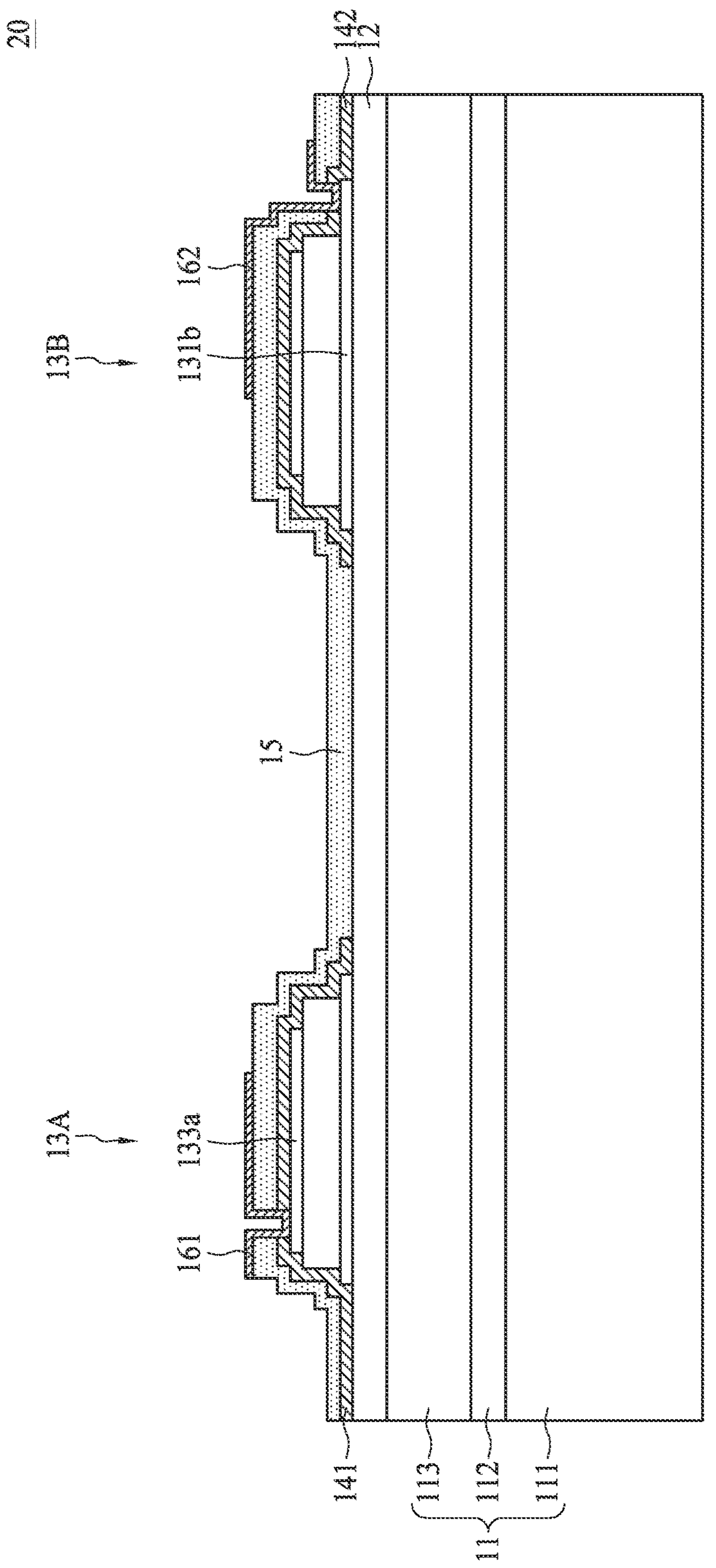
Figure 29:
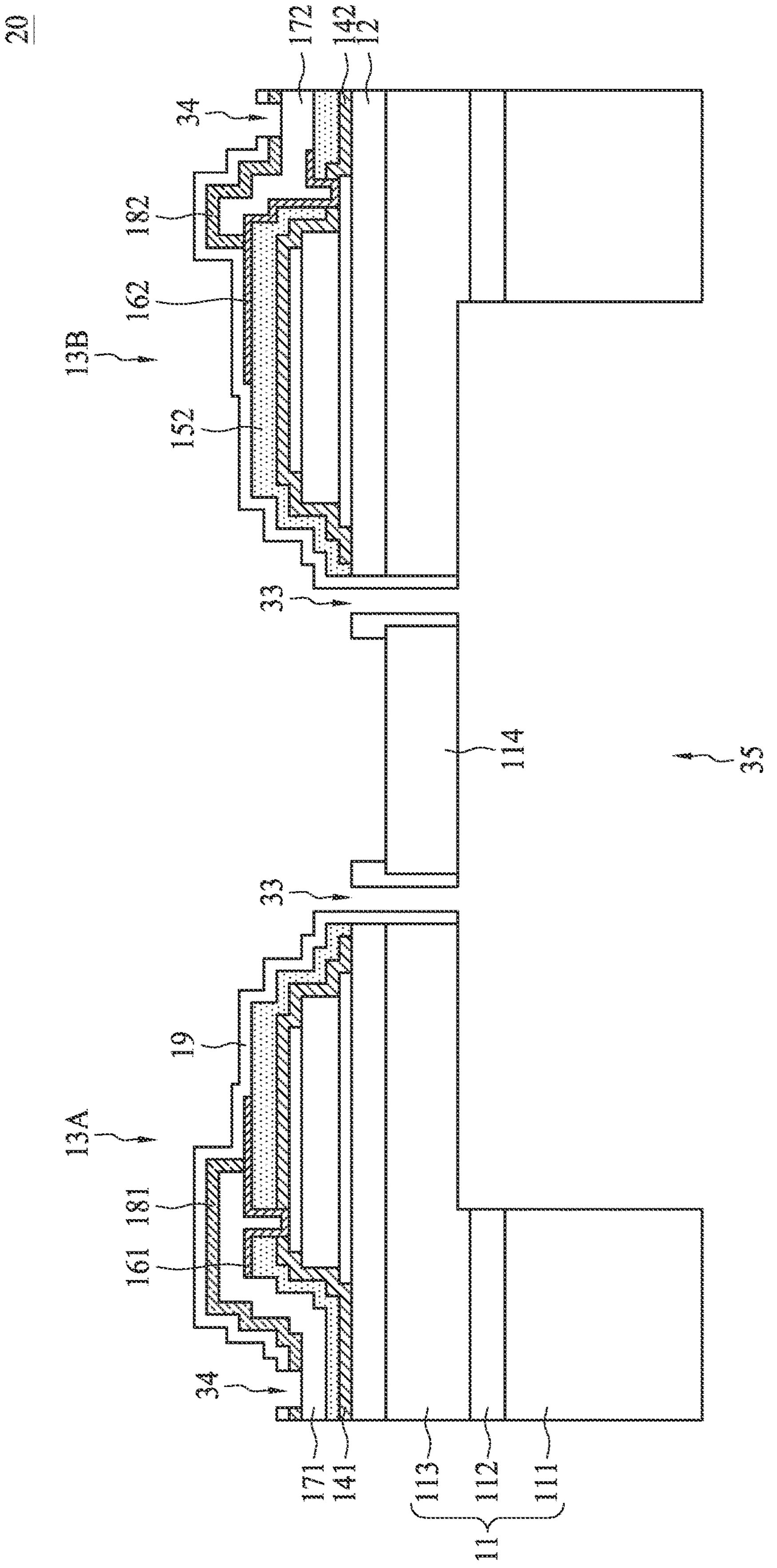

Please refer to FIGS. 27 to 29, which are schematic cross-sectional diagrams of the semiconductor structure 20 at different stages of the method 600 and/or the method 700 in accordance with alternative embodiments of the present disclosure. In some embodiments, a mask layer 43 is used in the patterning operation of the intermediate layer 16 as shown in FIG. 27. In some embodiments, intermediate segments 161 and 162 are defined by the mask layer 43 and are formed after the patterning operation. Operations as illustrated in FIGS. 15 to 17 and 20 to 26 are performed on the intermediate structure shown in FIG. 28, and the semiconductor structure 20 is formed as shown in FIG. 29.

Figure 30:
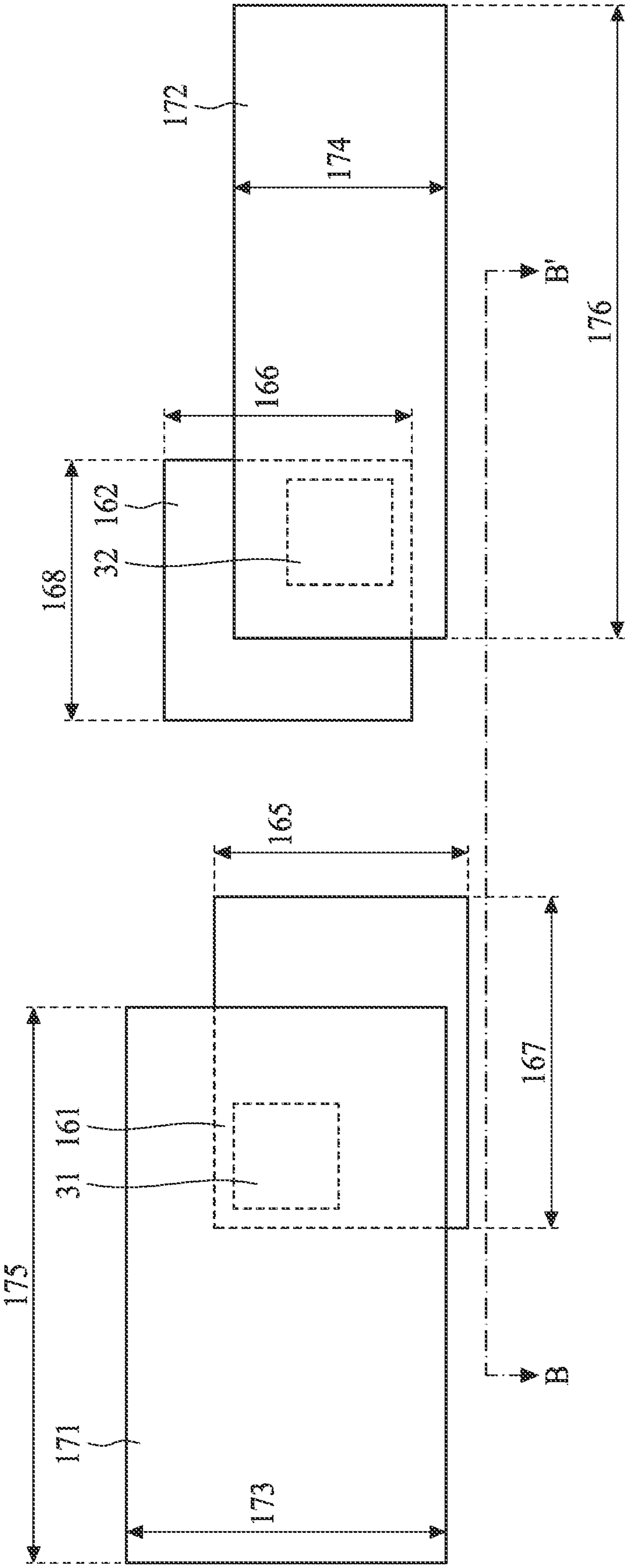
FIG. 30 is a schematic top-view perspective of different elements in accordance with some embodiments of the disclosure.
Figure 31:
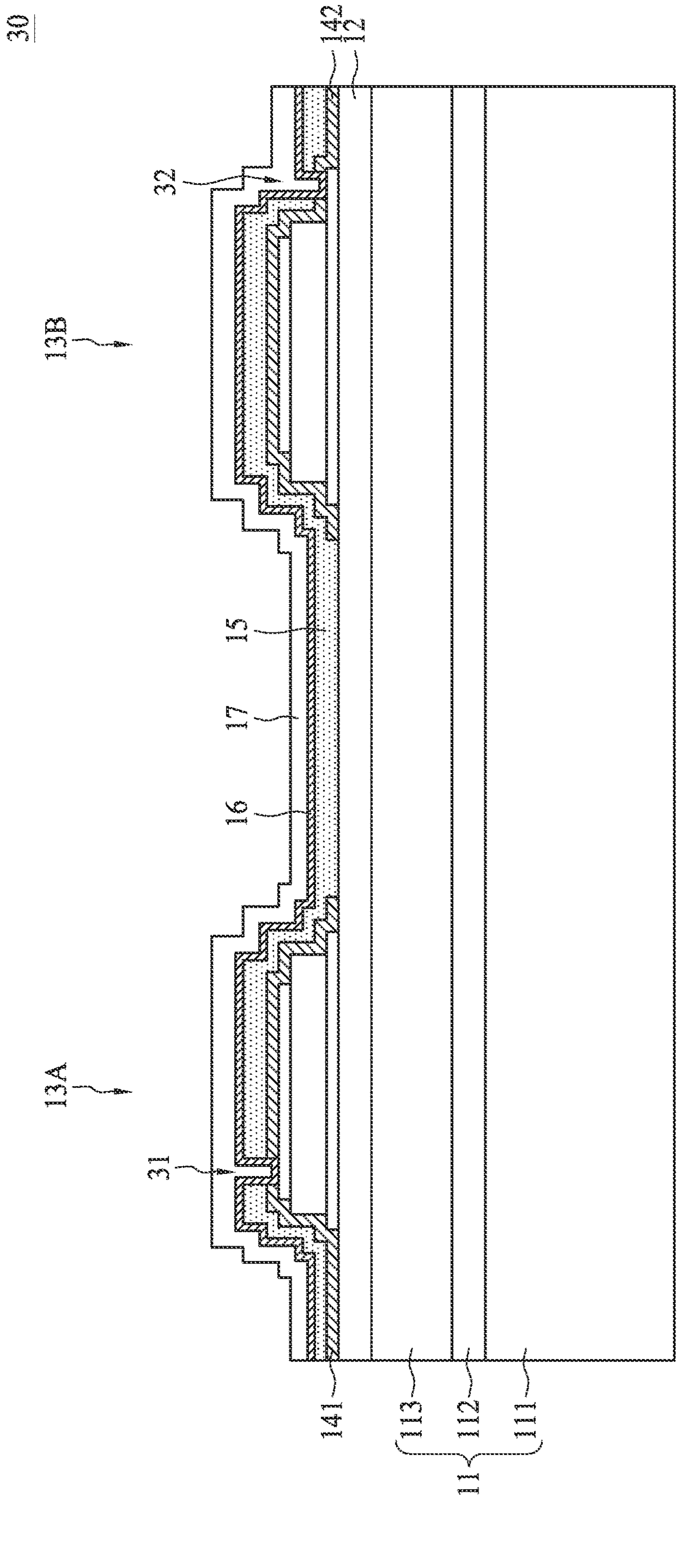
FIGS. 31 to 34 are schematic diagrams at different stages of a method for manufacturing a semiconductor structure in accordance with different embodiments of the disclosure.
Figure 32:
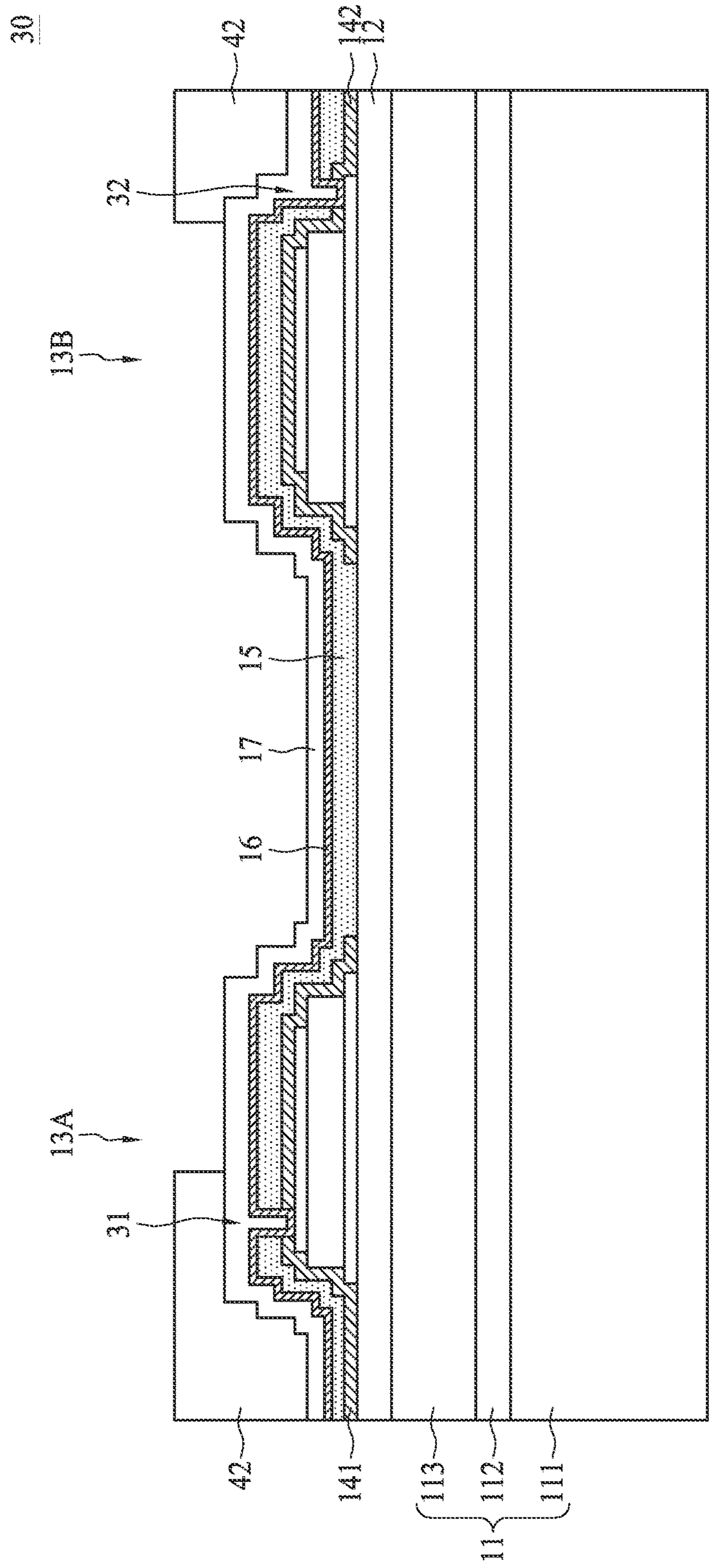
Figure 33:
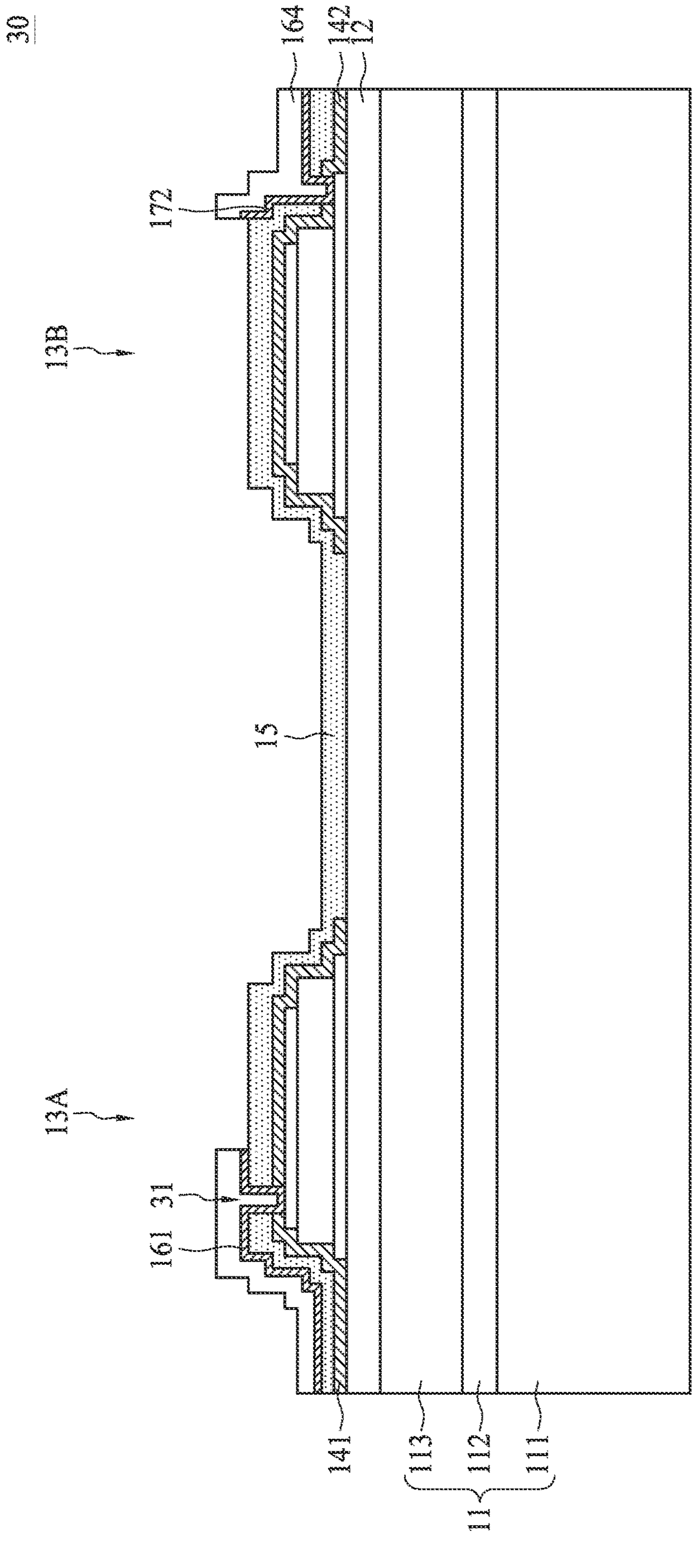

FIG. 30 is a schematic top-view perspective of the openings 31 and 32, the intermediate segments 161 and 162, and the conductive segments 171 and 172 in accordance with the embodiments shown in FIG. 29. In some embodiments, the intermediate segment 161 covers an entirety of the opening 31 and is partially exposed through the conductive segment 171. In some embodiments, the intermediate segment 162 covers an entirety of the opening 32 and is partially exposed through the conductive segment 172. The width 165 of the intermediate segment 161 can be substantially less than, equal to, or greater than the width 173 of the conductive segment 171. The width 166 of the intermediate segment 162 can be substantially less than, equal to, or greater than the width 174 of the conductive segment 172. Similarly, a relationship between a length (e.g., 167 or 168) of an intermediate segment (161 or 162) and a length (e.g., 175 or 176) of a corresponding conductive segment (171 or 172) can be substantially equal or different.

In other alternative embodiments as described above, a dry etching operation is performed to pattern the conductive layer 17 and the intermediate layer 16 concurrently, and a configuration of the intermediate segments 161 and 162 is substantially same as a configuration of the conductive segments 171 and 172 from a top-view perspective. FIGS. 31 to 35 are schematic diagrams of a semiconductor structure 30 at different stages of the method 600 and/or the method 700 and from different aspects of a semiconductor structure 30 in accordance with other alternative embodiments of the present disclosure. For ease of illustration, reference numerals with similar or same functions and properties are repeatedly used in different embodiments and figures, and for a purpose of brevity, only differences from other embodiments are emphasized in the following specification, and repeated descriptions of similar or same elements, functions and properties are omitted.

Figure 34:
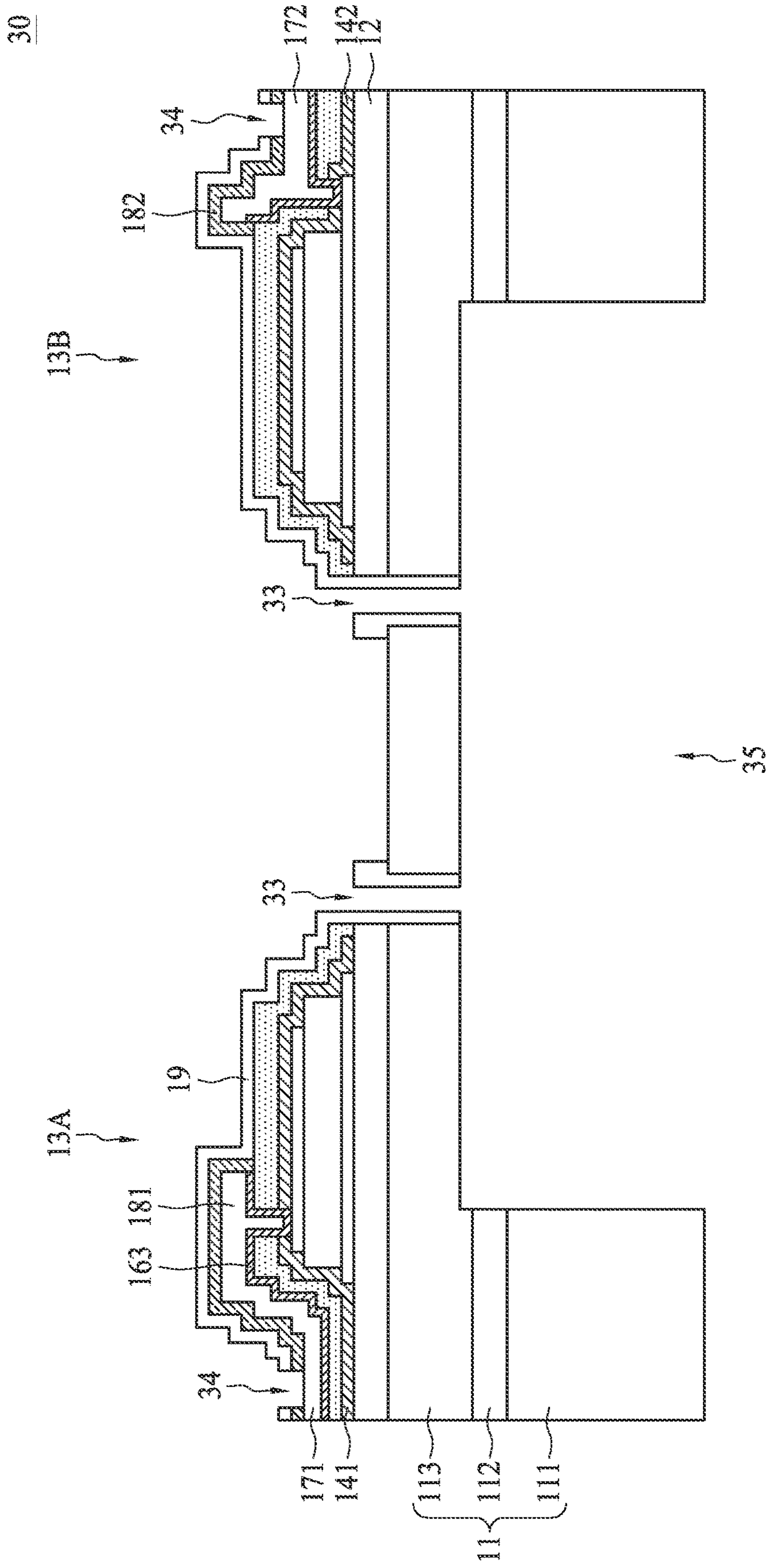

Please refer to FIGS. 31 to 34, which are schematic cross-sectional diagrams of the semiconductor structure 30 at different stages of the method 600 and/or the method 700 in accordance with alternative embodiments of the present disclosure. In some embodiments, the conductive layer 17 is formed after the formation of the conductive layer 16 without the patterning of the conductive layer 16 or the using of the first mask layer 41. In some embodiments, a dry etching operation is performed on the conductive layer 17 and the intermediate layer 16 using the second mask layer 42 as a mask. Operations as illustrated in FIGS. 20 to 26 are performed on the intermediate structure shown in FIG. 33, and the semiconductor structure 30 is formed as shown in FIG. 34.

Figure 35:
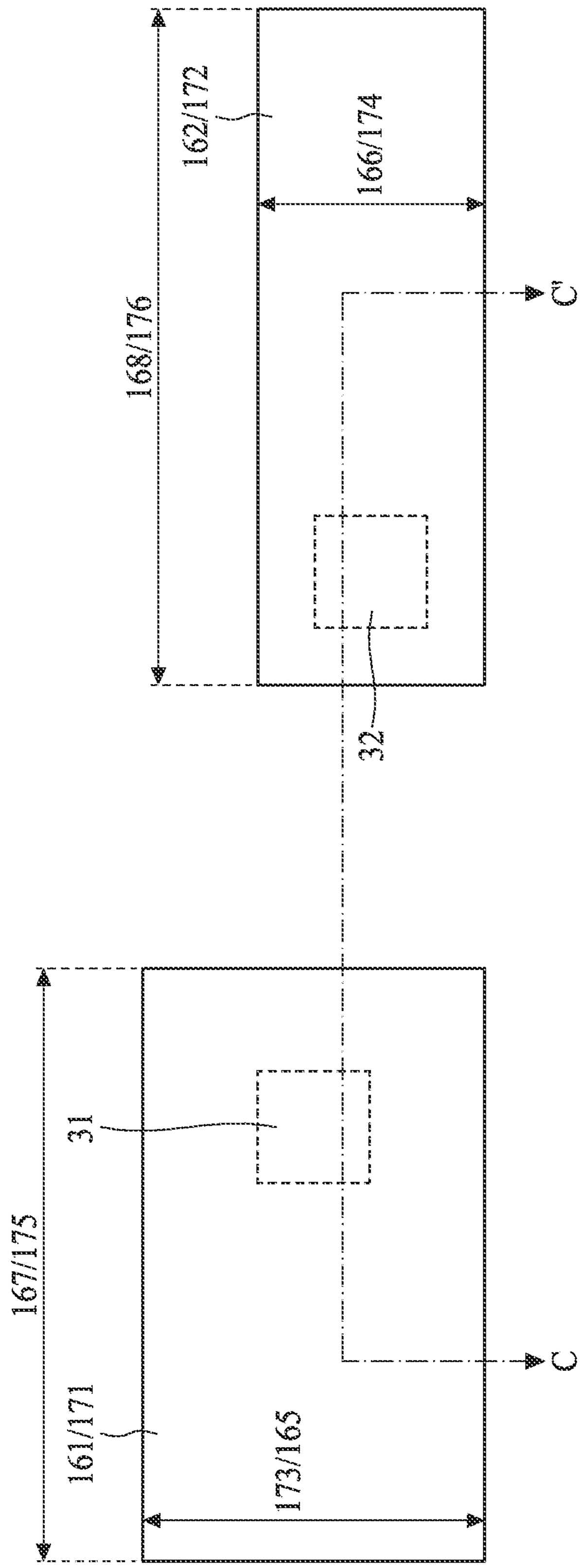
FIG. 35 is a schematic top-view perspective of different elements in accordance with some embodiments of the disclosure.

FIG. 35 is a schematic top-view perspective of the openings 31 and 32, the intermediate segments 161 and 162, and the conductive segments 171 and 172 in accordance with the embodiments shown in FIG. 34. In some embodiments, the intermediate segment 161 covers an entirety of the opening 31 and a sidewall of the intermediate segment 161 is substantially aligned with that of the conductive segment 171 from the top-view perspective as shown in FIG. 35. Similarly, in such embodiments, the intermediate segment 162 covers an entirety of the opening 32 and a sidewall of the intermediate segment 162 is substantially, aligned with that of the conductive segment 172 from the top-view perspective as shown in FIG. 35.

In accordance with some embodiments of the disclosure, a method for manufacturing a semiconductor structure is provided. The method may include several operations. A piezoelectric capacitor is formed over a substrate, wherein the piezoelectric capacitor includes a metal electrode. An intermediate layer is formed on the metal electrode, and is patterned using a first mask layer as a mask. A metal layer is formed on the intermediate layer, wherein the metal layer electrically connects to the metal electrode. The metal layer is patterned using a second mask layer, wherein the intermediate layer is within a coverage area of the metal layer from a top-view perspective after the patterning of the metal layer.

In accordance with some embodiments of the disclosure, a method for manufacturing a semiconductor structure is provided. The method may include several operations. A first piezoelectric capacitor and a second piezoelectric capacitor are formed over a substrate. An intermediate segment is formed. The intermediate segment covers a portion of a first metallic surface of the first piezoelectric capacitor and a portion of a second metallic surface of the second piezoelectric capacitor, and the first metallic surface and the second metallic surface are at different elevations. A conductive segment is formed. The conductive segment electrically connects to the intermediate segment, wherein a width of the conductive segment is substantially equal to or greater than a width of the intermediate segment from a top view. A passivation layer is formed over the conductive segment, and a portion of the conductive segment is exposed.

In accordance with some embodiments of the disclosure, a semiconductor structure is provided. The structure includes a piezoelectric capacitor, a high-k material layer, a dielectric layer, an intermediate segment, a conductive segment, a first recess and a second recess. The piezoelectric capacitor is disposed over a first surface of a substrate, wherein the piezoelectric capacitor is tapered from the first surface. The high-k material layer is disposed over the piezoelectric capacitor. The dielectric layer is disposed over the high-k material layer. The intermediate segment is disposed on a metallic surface of the piezoelectric capacitor. The conductive segment is disposed over the intermediate segment, wherein the intermediate segment is within a coverage area of the conductive segment from a top-view perspective, and the conductive segment is separated from the metallic surface by the intermediate segment. The first recess is disposed adjacent to the piezoelectric capacitor and indented from a second surface, opposite to the first surface of the substrate, toward the first surface. The second recess is indented from the first surface toward the second surface and connected to the first recess.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a piezoelectric capacitor over a semiconductor substrate, wherein the piezoelectric capacitor includes a metal electrode;

forming an intermediate layer on the metal electrode;

patterning the intermediate layer using a first mask layer;

forming a metal layer on the intermediate layer, wherein the metal layer is electrically connected to the metal electrode, wherein the metal layer covers an entirety of the intermediate layer; and patterning the metal layer using a second mask layer by performing a wet etching operation with an acidic etchant, wherein the intermediate layer is kept separate from the acidic etchant by the metal layer during the wet etching operation.

2. The method of claim 1, wherein the piezoelectric capacitor is tapered from the semiconductor substrate.

3. The method of claim 2, wherein a width of the second mask layer is substantially greater than a width of the first mask layer from top-view perspectives.

4. The method of claim 1, wherein interaction between the intermediate layer and the etchant is suppressed during the wet etching operation.

5. The method of claim 1, wherein the intermediate layer contacts the metal layer and the metal electrode.

6. The method of claim 1, further comprising:

forming a high-k material layer conformally over the piezoelectric capacitor;

forming a dielectric layer conformally over the high-k material layer; and exposing a portion of the metal electrode prior to the forming of the intermediate layer.

7. The method of claim 6, wherein the intermediate layer contacts the high-k material layer and the dielectric layer.

8. The method of claim 1, wherein the metal electrode is a bottom electrode disposed under a piezoelectric material of the piezoelectric capacitor, and the bottom electrode protrudes farther than the piezoelectric material.

9. The method of claim 1, wherein the metal electrode is a top electrode disposed above a piezoelectric material of the piezoelectric capacitor, and the piezoelectric material protrudes farther than the top electrode.

10. A method for manufacturing a semiconductor structure, comprising:

forming a first piezoelectric capacitor over a semiconductor substrate, wherein the first piezoelectric capacitor includes a first metal electrode;

forming a first intermediate layer on the first metal electrode;

patterning the first intermediate layer using a first mask layer;

forming a first metal layer on the first intermediate layer, wherein the first metal layer is electrically connected to the first metal electrode, wherein the first metal layer covers an entirety of the first intermediate layer from a top-view perspective and an elevation perspective; and patterning the first metal layer using a second mask layer by performing a wet etching operation with an acidic etchant, wherein the first intermediate layer is kept separate from the acidic etchant by the first metal layer during the wet etching operation.

11. A method for manufacturing a semiconductor structure, comprising:

forming a piezoelectric capacitor over a semiconductor substrate, wherein the piezoelectric capacitor includes a metal electrode;

forming an intermediate layer on the metal electrode;

patterning the intermediate layer using a first mask layer;

forming a metal layer on the intermediate layer, wherein the metal layer is electrically connected to the metal electrode, wherein the metal layer overlaps an entirety of the intermediate layer; and patterning the metal layer using a second mask layer by performing a wet etching operation with an acidic etchant, wherein the intermediate layer is kept separate from the acidic etchant by the metal layer from the upper surface and the side surfaces of the intermediate layer during the wet etching.

12. The method of claim 10, wherein a width of the second mask layer is greater than a width of the first mask layer from a top-view perspective.

13. The method of claim 10, wherein interaction between the intermediate layer and the etchant is suppressed during the wet etching operation.

14. The method of claim 10, wherein the first intermediate layer contacts the first metal layer and the first metal electrode.

15. The method of claim 10, further comprising:

forming a high-k material layer conformally over the first piezoelectric capacitor;

forming a dielectric layer conformally over the high-k material layer; and exposing a portion of the first metal electrode prior to the forming of the first intermediate layer.

16. The method of claim 15, wherein the first intermediate layer contacts the high-k material layer and the dielectric layer.

17. The method of claim 10, wherein the first metal electrode is a bottom electrode disposed under a piezoelectric material of the first piezoelectric capacitor, and the bottom electrode protrudes farther than the piezoelectric material.

18. The method of claim 10, wherein the first metal electrode is a top electrode disposed above a piezoelectric material of the first piezoelectric capacitor, and the piezoelectric material protrudes farther than the top electrode.

19. The method of claim 11, wherein a width of the second mask layer is greater than a width of the first mask layer from a top-view perspective.

20. The method of claim 11, wherein interaction between the intermediate layer and the etchant is suppressed during the wet etching operation.

* * * * *